(12) United States Patent
Inoue et al.

(10) Patent No.: US 11,114,318 B2
(45) Date of Patent: Sep. 7, 2021

(54) ASSEMBLING APPARATUS AND ASSEMBLING METHOD FOR SEMICONDUCTOR MANUFACTURING APPARATUS

(71) Applicant: Tokyo Electron Limited, Tokyo (JP)

(72) Inventors: Hisashi Inoue, Iwate (JP); Masahiro Kobayashi, Iwate (JP); Michihiro Takahashi, Iwate (JP); Tamotsu Hatakeyama, Iwate (JP); Harunari Hasegawa, Iwate (JP); Hiroshi Kikuchi, Iwate (JP); Yoshihisa Kumagai, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 16/394,140

(22) Filed: Apr. 25, 2019

(65) Prior Publication Data
US 2019/0333789 A1 Oct. 31, 2019

(30) Foreign Application Priority Data
Apr. 27, 2018 (JP) .............................. JP2018-086899

(51) Int. Cl.
*B23P 19/10* (2006.01)
*H01L 21/67* (2006.01)
*H01L 21/673* (2006.01)
*B23P 19/04* (2006.01)

(52) U.S. Cl.
CPC ........ *H01L 21/67109* (2013.01); *B23P 19/10* (2013.01); *H01L 21/67017* (2013.01); *H01L 21/67303* (2013.01); *B23P 19/04* (2013.01); *H01L 21/67005* (2013.01)

(58) Field of Classification Search
CPC .... B23P 19/04; B23P 19/10; H01L 21/67005; H01L 21/67303
See application file for complete search history.

(56) References Cited

U.S. PATENT DOCUMENTS

2008/0083109 A1   4/2008  Shibata et al.
2009/0101472 A1*  4/2009  Hishiya ............. H01L 21/67754
                                              198/474.1

(Continued)

FOREIGN PATENT DOCUMENTS

JP    04-206635 A    7/1992
JP    08-115908 A    5/1996

*Primary Examiner* — Jermie E Cozart
(74) *Attorney, Agent, or Firm* — Abelman, Frayne & Schwab

(57) ABSTRACT

Provided is an assembling apparatus for a semiconductor manufacturing apparatus. The assembling apparatus includes: a body; lift attached to the body and configured to move a reaction tube having an opening at a lower end portion thereof vertically, thereby allowing a gas supply pipe to be installed inside the reaction tube through the opening while the reaction tube is held by the lift; gas supply source configured to supply a gas into the reaction tube through the gas supply pipe while the reaction tube is held by the lift; and an exhaust mechanism including a pump configured to exhaust an inside of the reaction tube through the opening, thereby performing a leakage test of the reaction tube while the reaction tube is held by the lift.

11 Claims, 31 Drawing Sheets

(56) References Cited

U.S. PATENT DOCUMENTS

| | | | |
|---|---|---|---|
| 2009/0250005 A1* | 10/2009 | Kaneko | H01L 21/67109 118/724 |
| 2011/0303152 A1* | 12/2011 | Asari | H01L 21/67303 118/725 |
| 2017/0256430 A1* | 9/2017 | Kinoshita | H01L 21/67745 |
| 2018/0182652 A1* | 6/2018 | Seshimo | H01L 21/67017 |

* cited by examiner

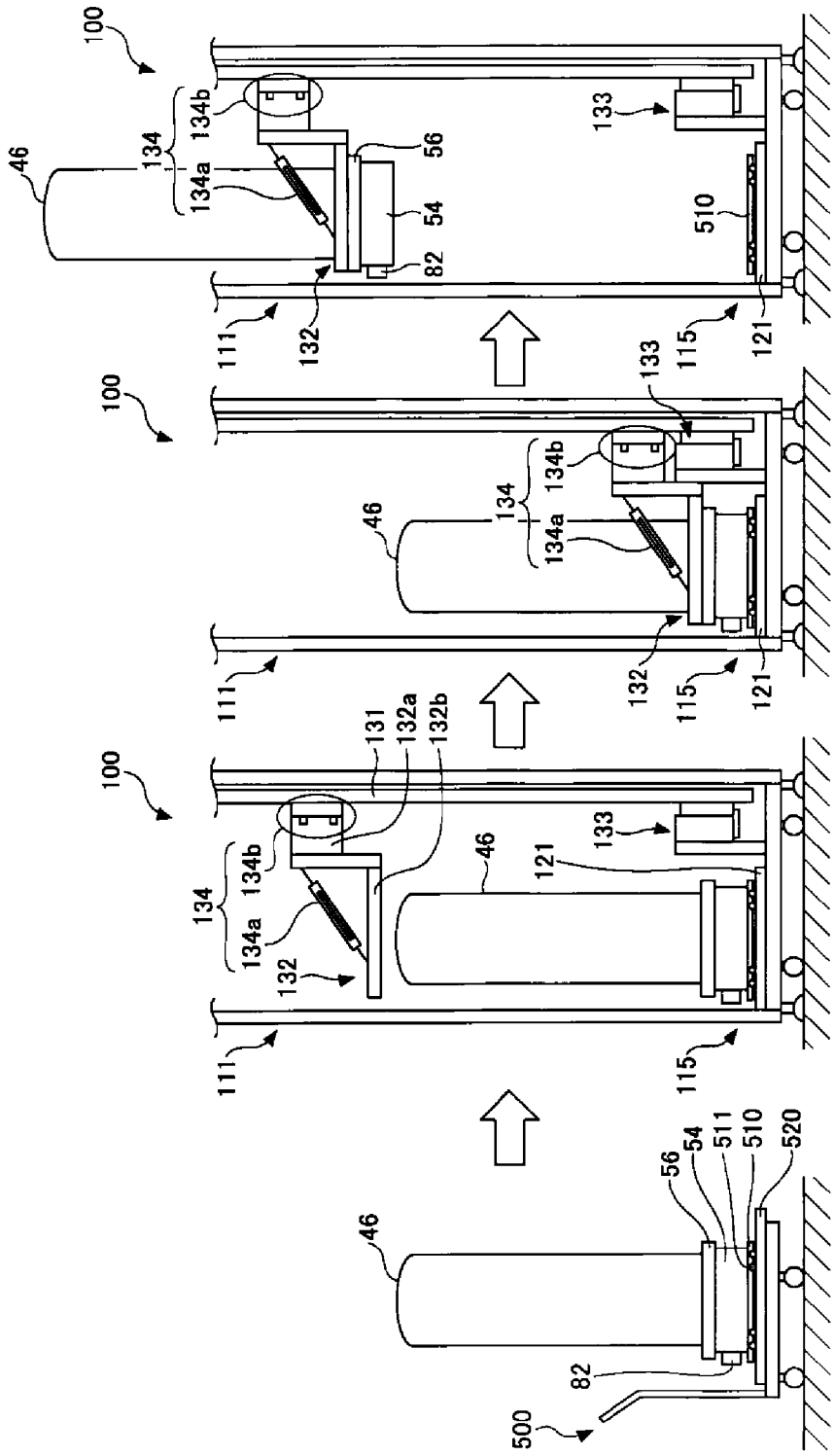

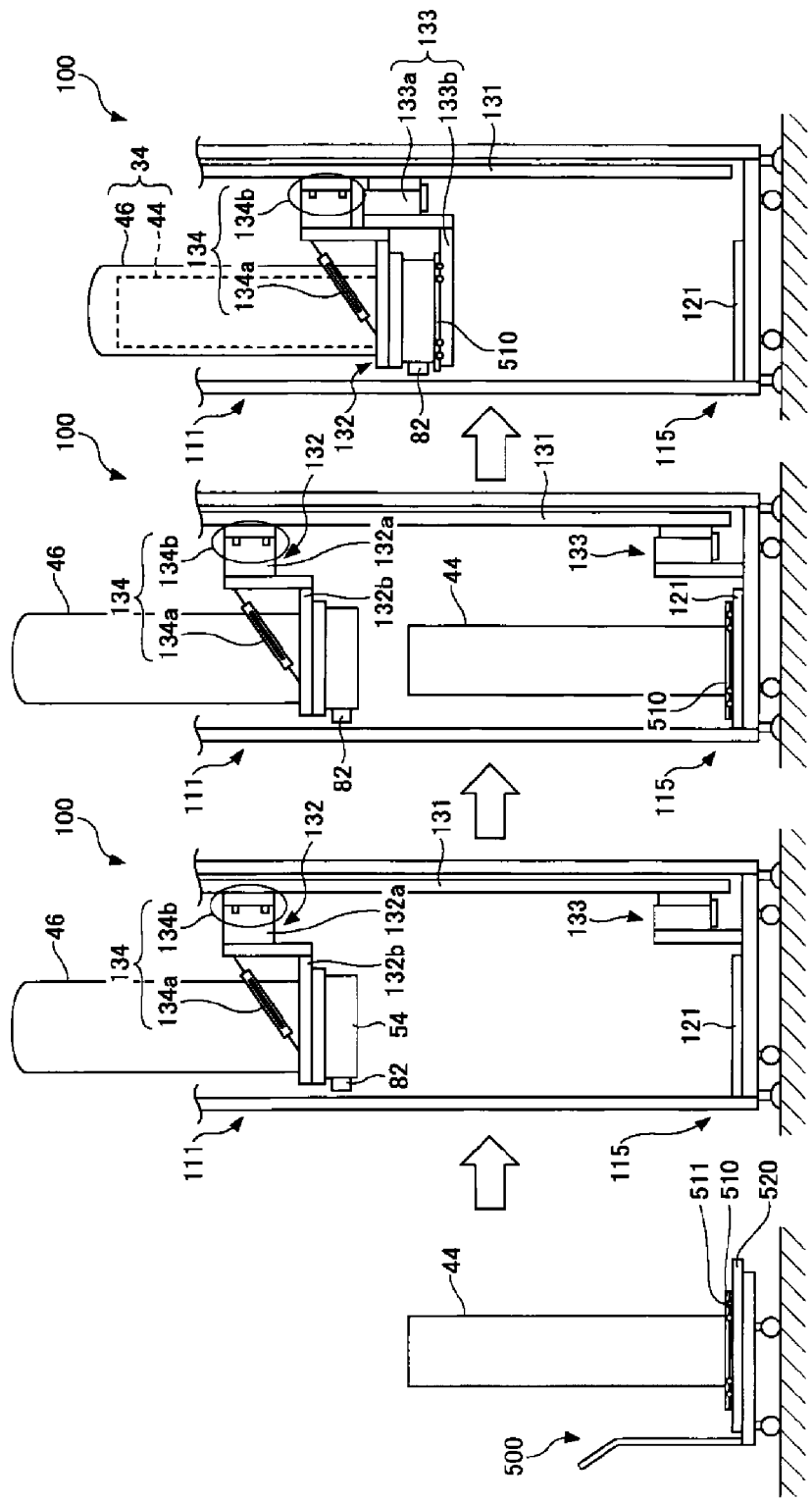

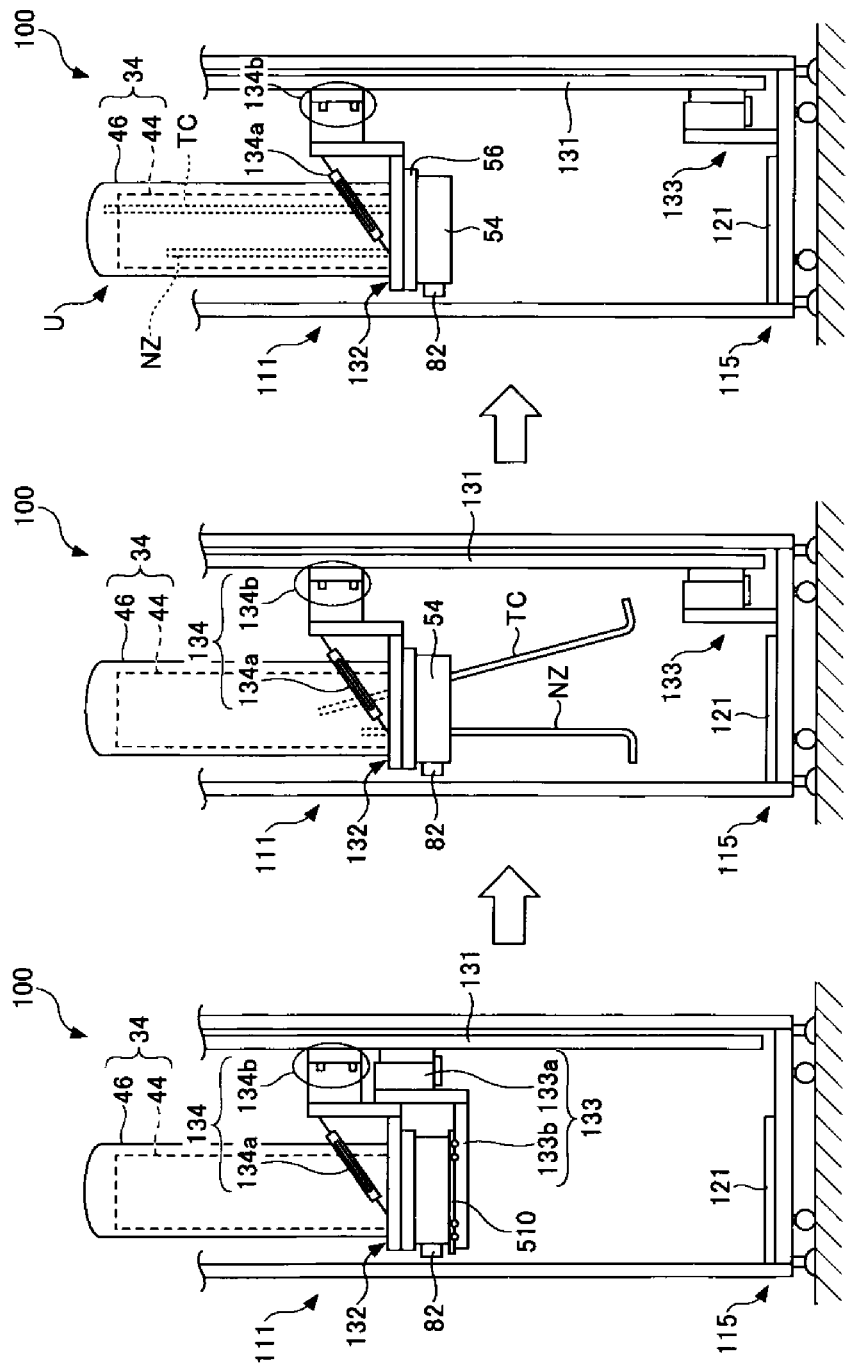

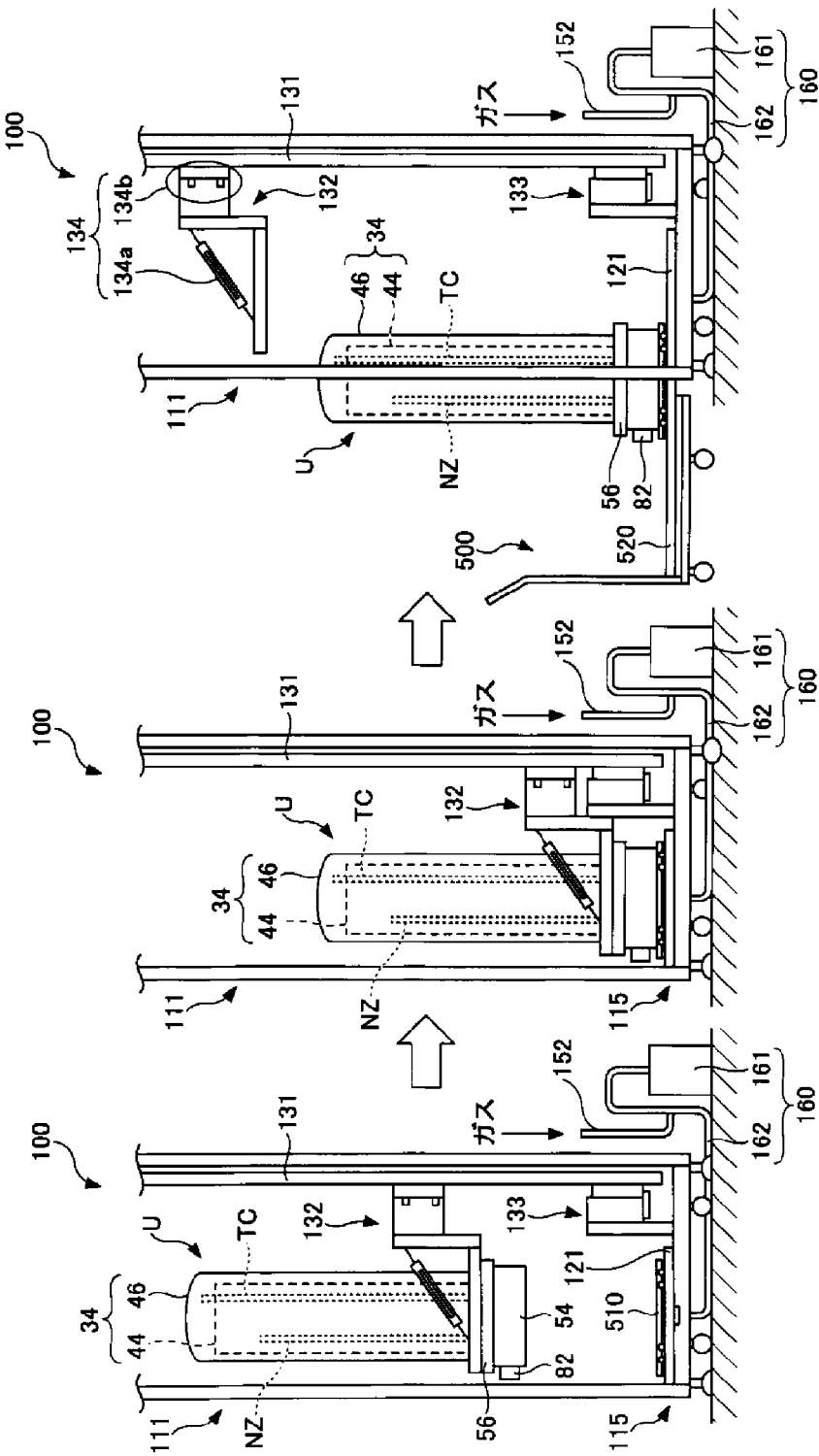

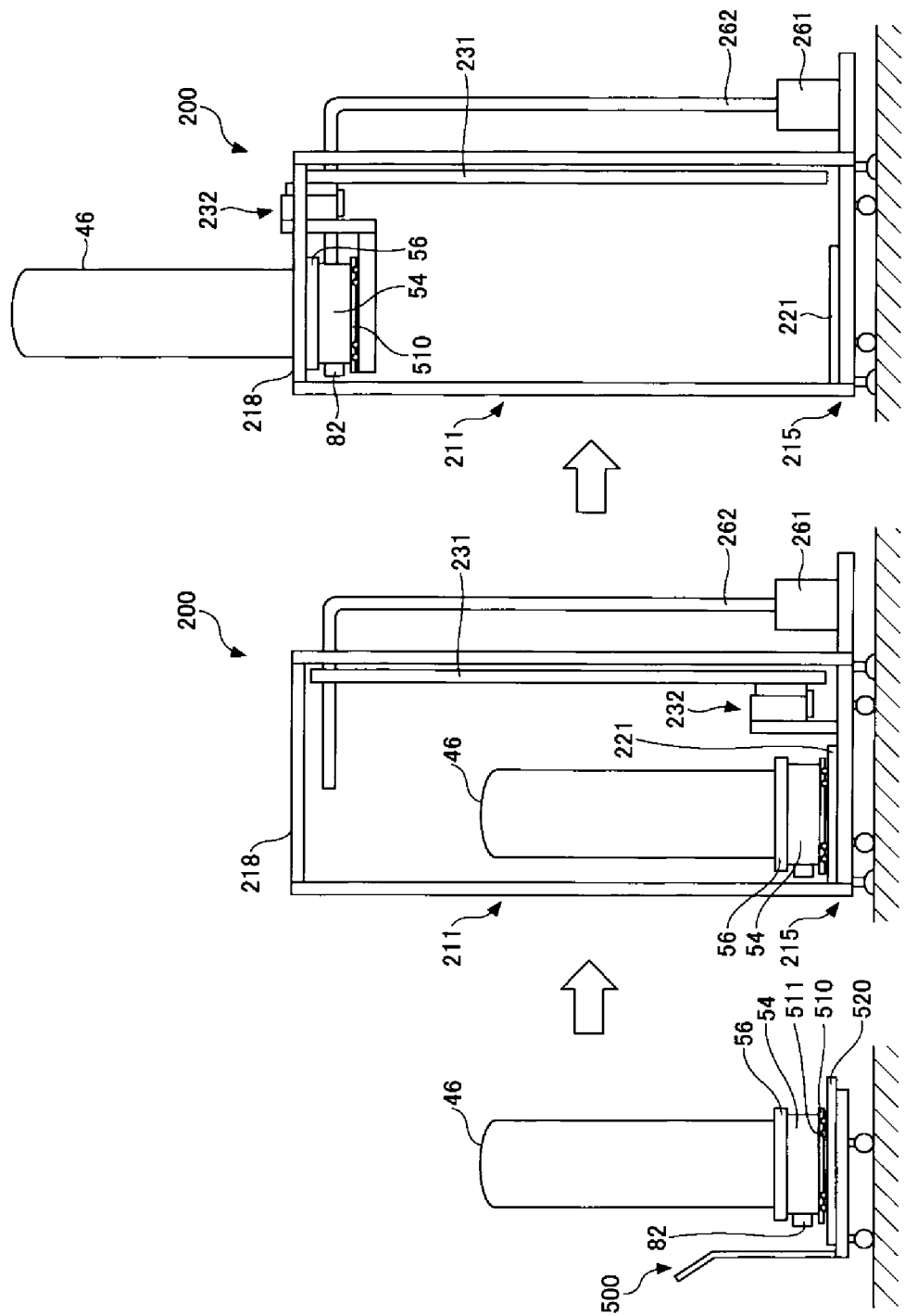

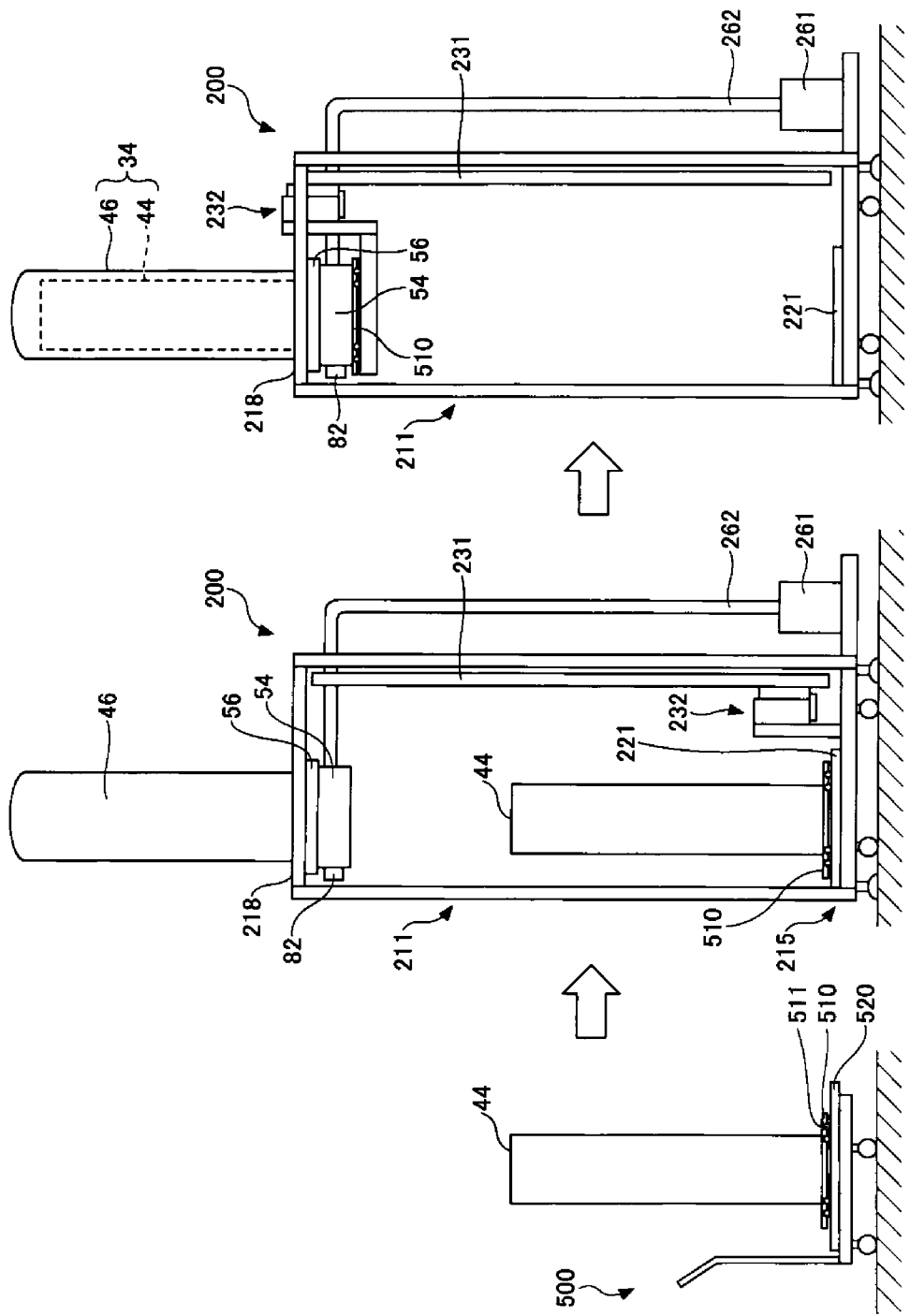

ASSEMBLING APPARATUS AND ASSEMBLING METHOD FOR SEMICONDUCTOR MANUFACTURING APPARATUS

CROSS-REFERENCE TO RELATED APPLICATIONS

This application is based on and claims priority from Japanese Patent Application No. 2018-086899 filed on Apr. 27, 2018 with the Japan Patent Office, the disclosure of which is incorporated herein in its entirety by reference.

TECHNICAL FIELD

The present disclosure relates to an assembling apparatus and an assembling method for a semiconductor manufacturing apparatus.

BACKGROUND

A semiconductor manufacturing apparatus such as a batch type heat treatment apparatus that performs a processing on a plurality of substrates at once is assembled by attaching a plurality of components (e.g., a reaction tube, a gas introducing pipe, and a thermocouple) at a place where the apparatus is installed (see, e.g., Japanese Patent Laid-Open Publication Nos. 8-115908 and 4-206635).

SUMMARY

According to an aspect of the present disclosure, there is provided is an assembling apparatus for a semiconductor manufacturing apparatus. The assembling apparatus includes: a body; lift attached to the body and configured to move a reaction tube having an opening at a lower end portion thereof vertically, thereby allowing a gas supply pipe to be installed inside the reaction tube through the opening while the reaction tube is held by the lift; gas supply source configured to supply a gas into the reaction tube through the gas supply pipe while the reaction tube is held by the lift; and an exhaust mechanism including a pump configured to exhaust an inside of the reaction tube through the opening, thereby performing a leakage test of the reaction tube while the reaction tube is held by the lift.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 13A to 13D are explanatory views for a step of carrying the outer tube into the assembling apparatus.

FIGS. 14A to 14D are explanatory views for a step of attaching an inner tube to an inside of the outer tube.

FIGS. 15A to 15C are explanatory views for a step of attaching a gas supply pipe.

FIGS. 17A to 17C are explanatory views for a step of carrying a reaction tube unit out from the assembling apparatus.

FIGS. 27A to 27C are explanatory views for a step of carrying an outer tube into the assembling apparatus.

FIGS. 28A to 28C are explanatory views for a step of attaching an inner tube to an inside of the outer tube.

DETAILED DESCRIPTION

Figure 1:
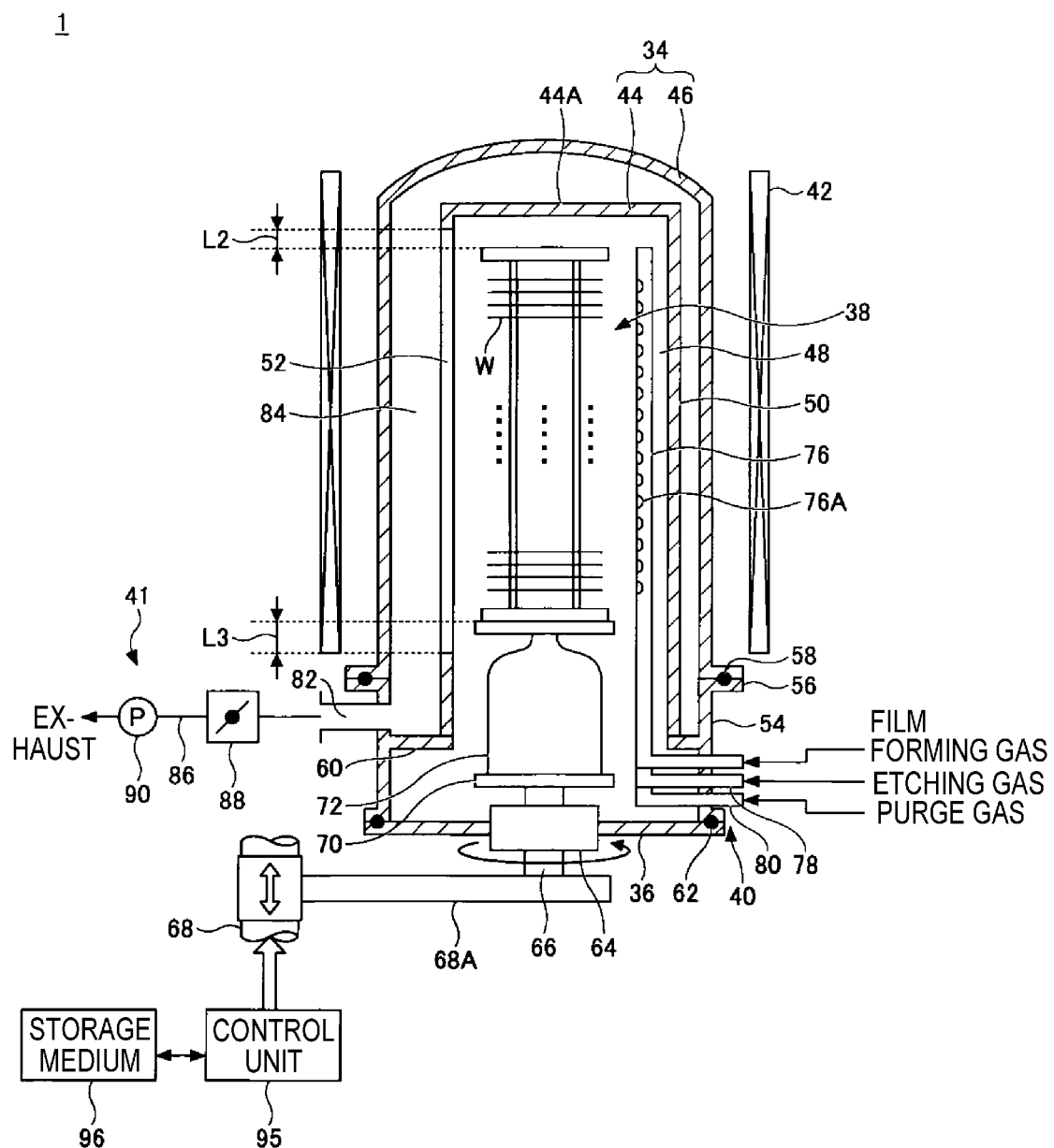
FIG. 1 is a longitudinal cross-sectional view illustrating an exemplary configuration of a longitudinal type heat treatment apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

Figure 2:
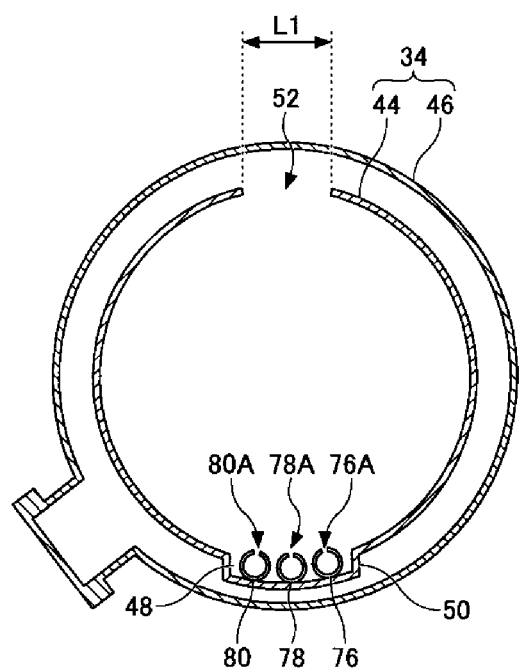
FIG. 2 is a horizontal cross-sectional view illustrating the exemplary configuration of the longitudinal type heat treatment apparatus.
Figure 3:
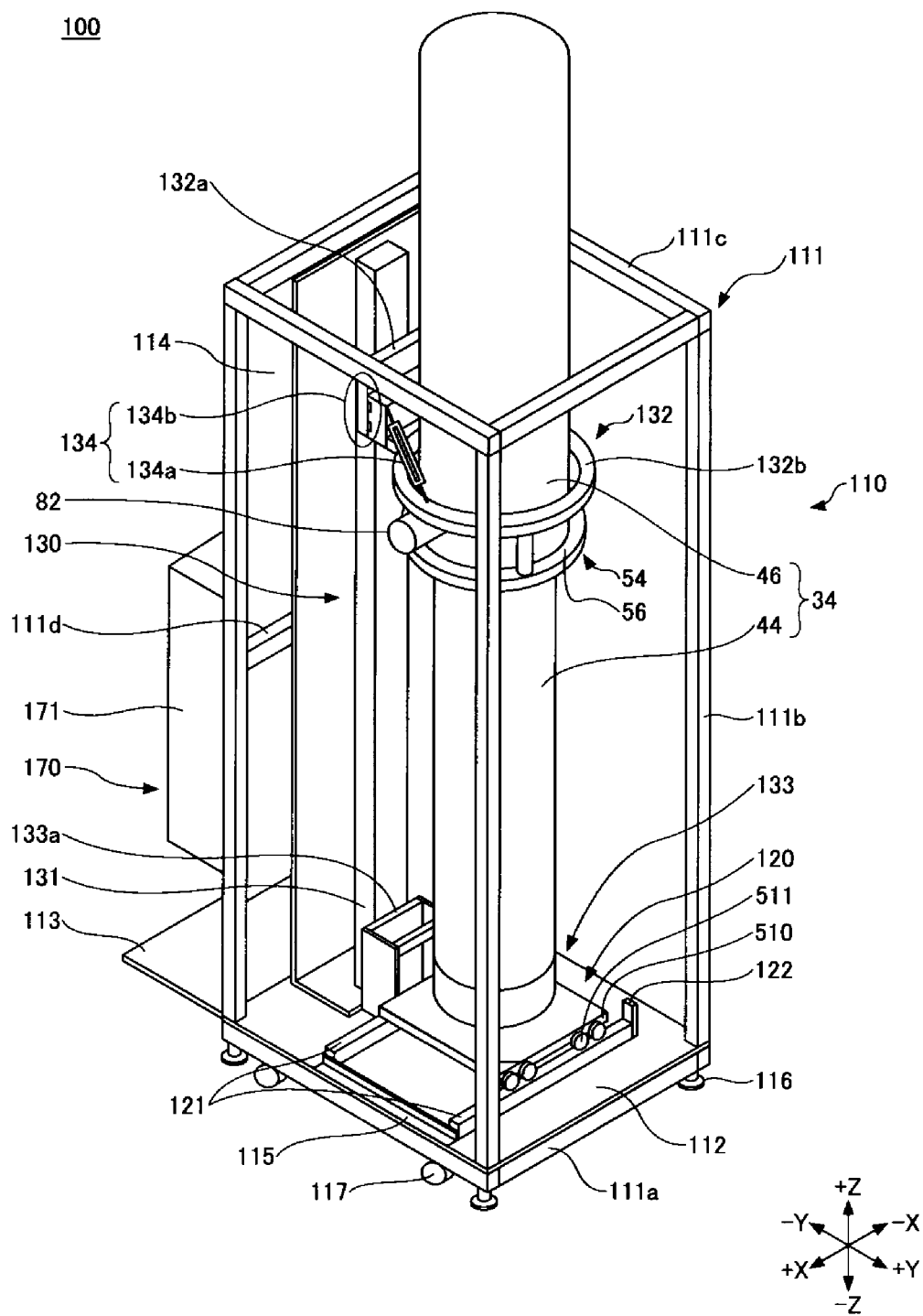
FIG. 3 is a perspective view (1) illustrating the exemplary configuration of an assembling apparatus according to a first embodiment.
Figure 4:
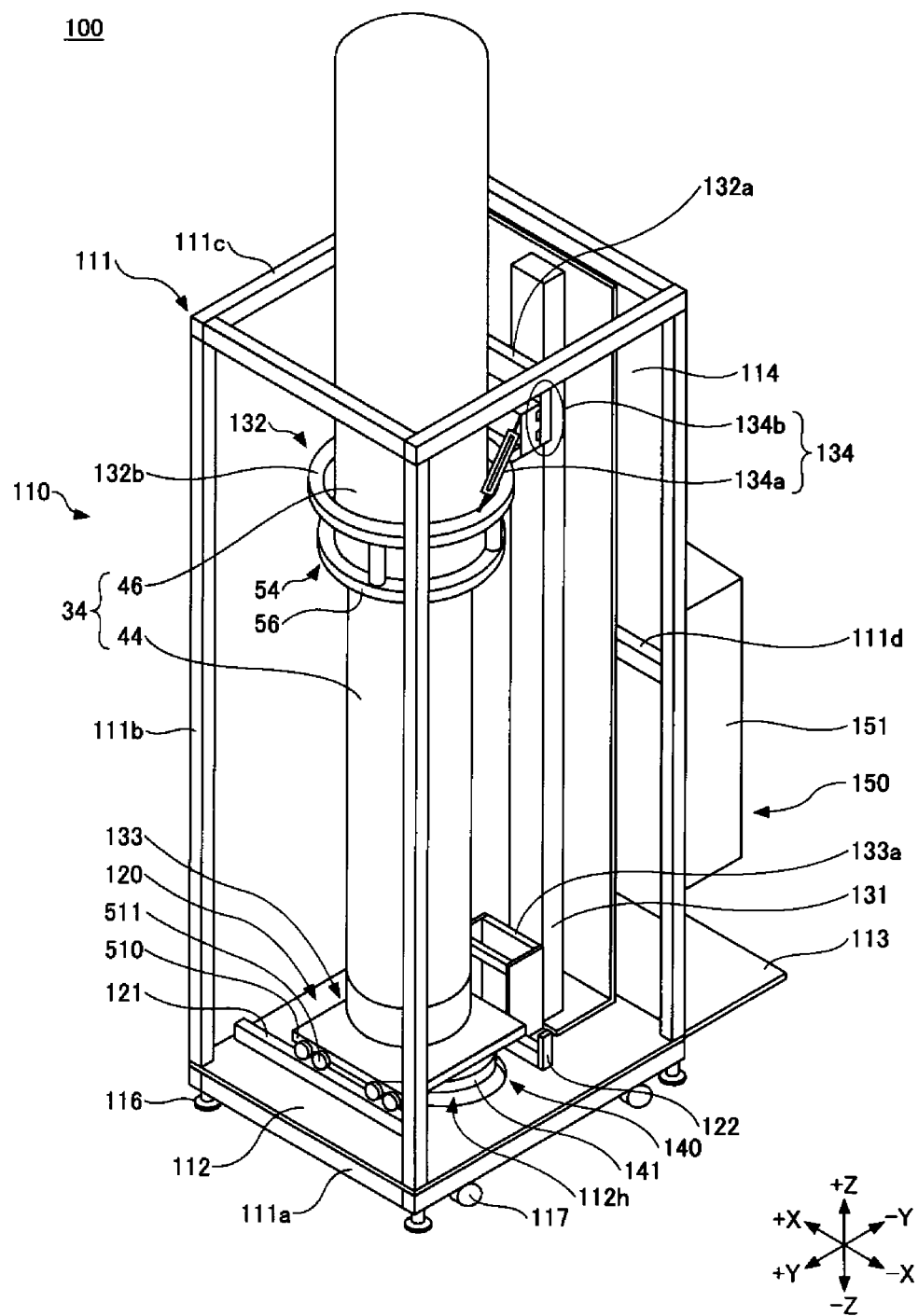
FIG. 4 is a perspective view (2) illustrating the exemplary configuration of the assembling apparatus according to the first embodiment.
Figure 5:
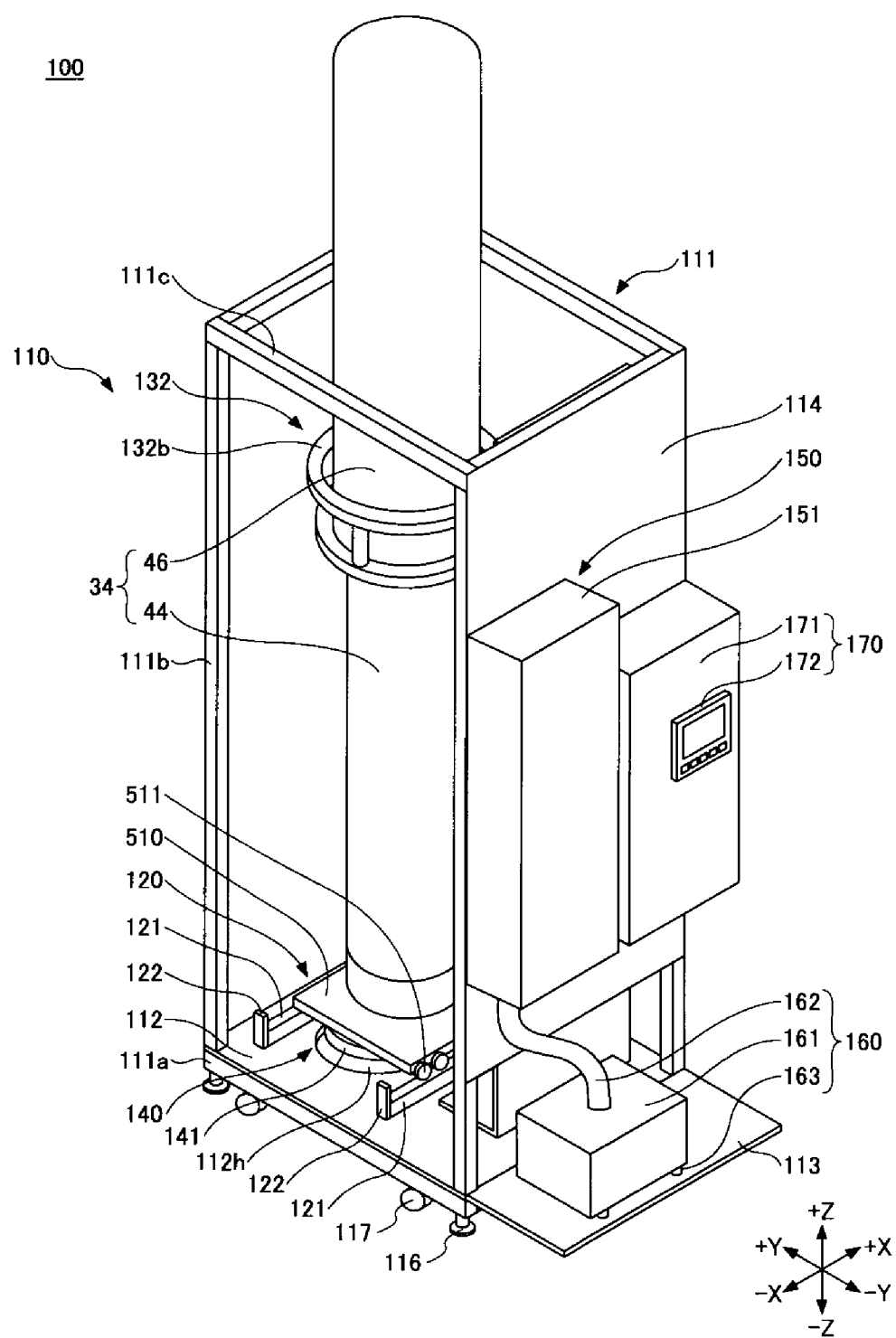
FIG. 5 is a perspective view (3) illustrating the exemplary configuration of the assembling apparatus according to the first embodiment.
Figure 6:
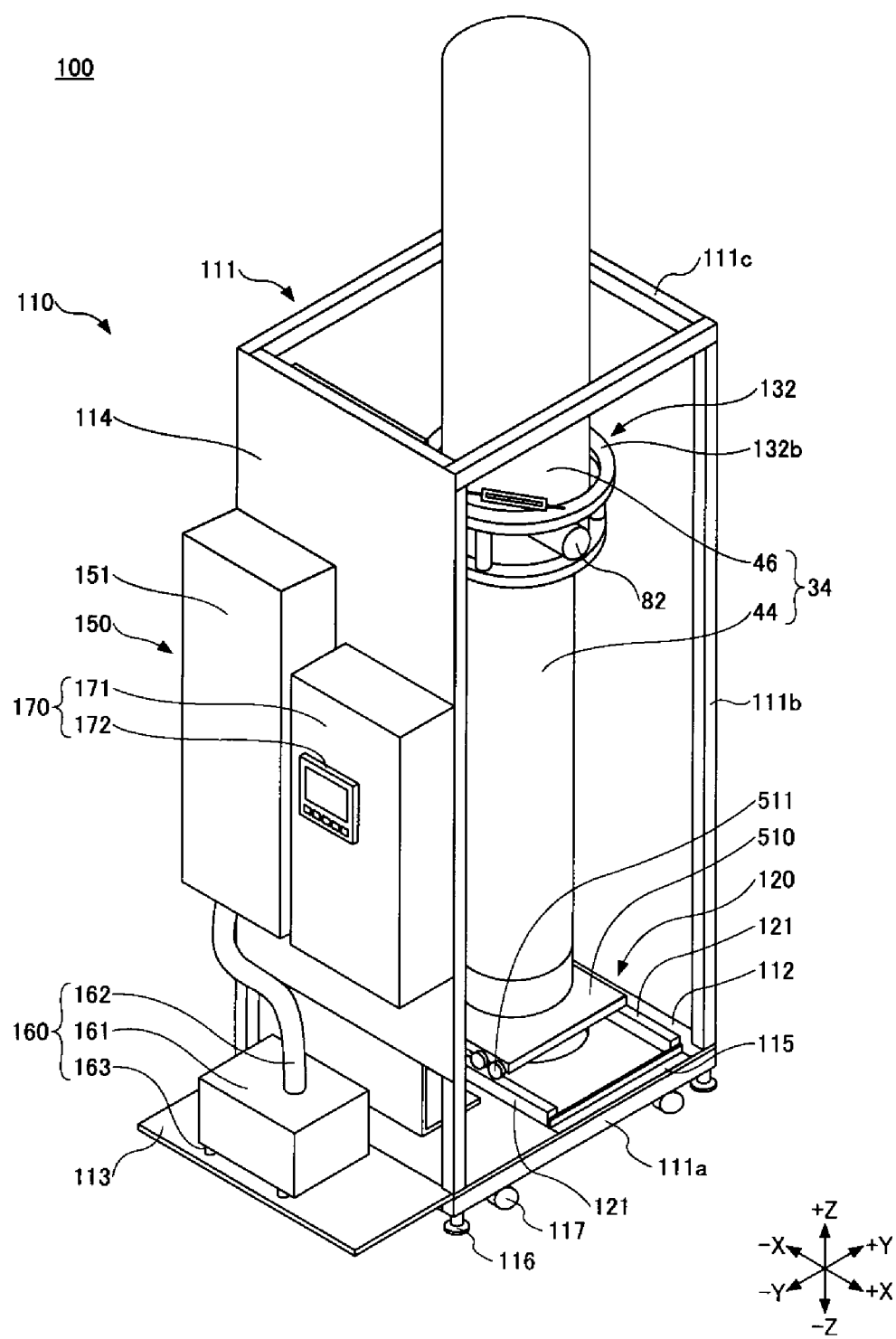
FIG. 6 is a perspective view (4) illustrating the exemplary configuration of the assembling apparatus according to the first embodiment.

First, an exemplary configuration of a longitudinal heat treatment apparatus capable of being assembled by using an assembling apparatus according to an embodiment will be described. Hereinafter, a longitudinal heat treatment apparatus having a double tube structure will be described, but a longitudinal heat treatment apparatus may have a single tube structure. FIG. 1 is a longitudinal cross-sectional view illustrating an exemplary configuration of a longitudinal type heat treatment apparatus. FIG. 2 is a horizontal cross-sectional view illustrating the exemplary configuration of the longitudinal type heat treatment apparatus.

As illustrated in FIG. 1, a longitudinal heat treatment apparatus 1 includes a reaction tube 34 that accommodates a semiconductor wafer (hereinafter, referred to as a "wafer W") which is a substrate, a cover 36 that air-tightly closes an opening at a lower end portion of the reaction tube 34, a wafer boat 38 that may be accommodated in the reaction tube 34 and is a substrate holder that holds a plural number of wafers W at predetermined intervals, a gas supply unit 40 that introduces a gas into the reaction tube 34, an exhaust unit 41 that exhausts the gas in the reaction tube 34, and a heating unit 42 that heats the wafer W.

The reaction tube 34 includes an inner tube 44 having a cylindrical shape that is opened at a lower end portion and has a ceiling, and an outer tube 46 having a cylindrical shape the is opened at a lower end portion and has a ceiling that covers an outside of the inner tube 44. The inner tube 44 and the outer tube 46 are formed of an insulating material such as quartz, and coaxially arranged to be a double tube structure.

A ceiling portion 44A of the inner tube 44 is, for example, flat. A nozzle accommodating portion 48 that accommodates a gas supply pipe along the longitudinal direction (vertical direction) thereof is formed at one side of the inner tube 44. For example, as illustrated in FIG. 2, a block portion 50 is formed by protruding a portion of a side wall of the inner tube 44 toward the outside, and the inside of the block portion 50 is formed as the nozzle accommodation portion 48. A rectangular opening 52 having a width L1 along the longitudinal direction (vertical direction) is formed on a side wall of an opposite side of the inner tube to be opposite to the nozzle accommodation portion 48.

The opening 52 is a gas exhaust port formed so as to exhaust the gas in the inner tube 44. The opening 52 has the same length as a length of the wafer boat 38, or extends in both the upper and lower directions to be longer than the length of the wafer boat 38. That is, an upper end portion of the opening 52 extends to be positioned at a height equal to or higher than a position corresponding to an upper end portion of the wafer boat 38, and an lower end portion of the opening 52 extends to be positioned at a height equal to or lower than a position corresponding to a lower end portion of the wafer boat 38. Specifically, as illustrated in FIG. 1, a distance L2 in the height direction between the upper end portion of the wafer boat 38 and the upper end portion of the opening 52 is in a range of about 0 mm to 5 mm. A. distance L3 in the height direction between the lower end portion of the wafer boat 38 and the lower end portion of the opening 52 is in a range of about 0 mm to 350 mm.

A lower end portion of the reaction tube 34 is supported by a cylindrical shape manifold 54 formed of, for example, stainless steel. A flange portion 56 is formed on an upper end portion of the manifold 54, and a lower end portion of the outer tube 46 is provided to be supported on the flange portion 56. A seal member 58 such as an O-ring is interposed between the flange portion 56 and the lower end portion of the outer tube 46 so that the inside of the outer tube is in an air-tightly sealed state.

An annular support portion 60 is provided at an inner wall of the upper portion of the manifold 54, and a lower end portion of the inner tube 44 is provided to be supported on the support portion 60. The cover 36 is air-tightly attached to an opening at a lower end portion of the manifold 54 through a seal member 62 such as an O-ring, so as to air-tightly close the opening at the lower end portion of the reaction tube 34, that is, the opening of the manifold 54. The cover 36 is made of, for example, stainless steel.

A rotation shaft 66 is provided at the center portion of the cover 36 to penetrate through a magnetic fluid sealing portion 64. A lower portion of the rotation shaft 66 is rotatably supported by an arm 68A of a lifting unit 68 constituted by a boat elevator.

A rotation plate 70 is provided at the upper end portion of the rotation shaft 66, and the wafer boat 38 that holds the wafers W is placed on the rotation plate 70 via a heat retention pedestal made of quartz. Therefore, the cover 36 and the wafer boat 38 are integrally moved up or down by lifting or lowering the lifting unit 68, so that the wafer boat 38 can be inserted into or removed from the reaction tube 34.

The gas supply unit 40 is provided at the manifold 54, and introduces a gas such as a film forming gas, an etching gas, or a purge gas. The gas supply unit 40 includes a plurality (e.g., three) of gas supply pipes 76, 78, and 80 made of quartz. Each of the gas supply pipes 76, 78, and 80 is provided in the inner tube 44 along the longitudinal direction thereof, and its base end is bent in an L shape and supported so as to penetrate the manifold 54.

As illustrated in FIG. 2, the gas supply pipes 76, 78, and 80 are provided to be aligned in a line along the circumferential direction in the nozzle accommodating portion 48 of the inner tube 44. A plurality of gas holes 76A, 78A, and 80A are formed on the gas supply pipes 76, 78, and 80, respectively, at predetermined intervals along the longitudinal direction, and the respective gases can be discharged horizontally from each of the gas holes 76A, 78A, and 80A. The predetermined intervals are set to be, for example, the same as the intervals of the wafers W supported by the wafer boat 38. Further, a position in a height direction is set such that each of the gas holes 76A, 78A, and 80A is positioned in the middle of the wafers W adjacent in the vertical direction, and each gas can be efficiently supplied to the space between the wafers W. As the type of gas, a film forming gas, an etching gas, and a purge gas are used, and each gas can be supplied through each of the gas supply pipes 76, 78, and 80 as necessary while controlling the flow rate of each gas.

A gas outlet 82 is formed above the support portion 60 that is a side wall of the upper portion of the manifold 54, and is configured to be able to exhaust the gas in the inner tube 44 discharged from the opening 52 through a space 84 between the inner tube 44 and the outer tube 46. The exhaust unit 41 is provided at the gas outlet 82. The exhaust unit 41 includes an exhaust passage 86 that is connected to the gas outlet 82, and a pressure adjusting valve 88 and a vacuum pump 90 are sequentially interposed in the exhaust passage 86 so as to make the inside of the reaction tube 34 in a vacuum state.

A cylindrical heating unit 42 is provided to cover the outer tube 46 at the outer peripheral side of the outer tube 46. The heating unit 42 heats the wafer W accommodated in the reaction tube 34.

An entire operation of the longitudinal heat treatment apparatus 1 is controlled by, for example, a control unit 95 such as a computer. Further, a computer program that performs the entire operation of the longitudinal heat treatment apparatus is stored in a storage medium 96. The storage medium 96 may be, for example, a flexible disk, a compact disk, a hard disk, a flash memory, and a DVD.

First Embodiment (Assembling Apparatus for Semiconductor Manufacturing Apparatus)

An assembling apparatus according to a first embodiment is an apparatus for assembling a reaction tube unit by attaching a plurality of components of a batch type longitudinal heat treatment apparatus that performs a heat treatment on a plural number of wafers at once. The components are, for example, a reaction tube, a gas introducing pipe, and a heat retention pedestal. The reaction tube may be a single tube structure, or a double tube structure having an inner tube and an outer tube. According to the assembling apparatus according to the first embodiment, the reaction tube unit may be assembled at a place different from a place where the longitudinal heat treatment apparatus is provided, and thus, it is easy to secure an operation space. As a result, since a plurality of operators may simultaneously perform the assembling operation of the reaction tube unit, it is possible to reduce an assembling work period of the longitudinal heat treatment apparatus. Further, since a plurality of operators may simultaneously perform maintenance of the reaction tube unit, it is possible to reduce downtime of the longitudinal heat treatment apparatus.

Hereinafter, an exemplary configuration of the assembling apparatus according to the first embodiment will be described. FIGS. 3 to 6 are perspective views illustrating the exemplary configuration of the assembling apparatus according to the first embodiment, and each drawing is a view illustrating a state viewed from a different viewpoint. Hereinafter, for convenience of explanation, in FIGS. 3 to 6, it will be described by assuming that +X direction is a front direction, −X direction is a rear direction, +Y direction is a right direction, −Y direction is a left direction, +Z direction is an upward direction, and −Z direction is a downward direction. In FIGS. 3 to 6, a state where the assembling apparatus holds the reaction tube is illustrated.

As illustrated in FIGS. 3 to 6, an assembling apparatus 100 includes a body 110, a slide mechanism 120, a lifting mechanism 130, a cover 140, a gas supply mechanism 150, an exhaust mechanism 160, and a controller 170.

The body 110 includes a frame 111, a first bottom plate 112, a second bottom plate 113, a side plate 114, a positioning portion 115, a leg portion 116, and a caster 117. The frame 111, the first bottom plate 112, the second bottom plate 113, and the side plate 114 form a box-like appearance that constitutes a case.

The frame 111 includes a lower frame 111*a*, a column 111*b*, and an upper frame 111*c*. The lower frame 111*a* is formed, for example, by connecting four aluminum frames in a rectangular shape. The column 111*b* is formed of, for example, four aluminum frames that extend upward in parallel with each other from 4 corners of the lower frame 111*a*. The upper frame 111*c* is formed, for example, by connecting four aluminum frames in a rectangular shape, and is connected to an upper end portion of the column 111*b*. Further, the frame 111 may have a reinforcing member 111*d* that connects and reinforces the aluminum frames, separately from the lower frame 111*a*, the column 111*b*, and the upper frame 111*c*.

The first bottom plate 112 is attached to an upper surface of the lower frame 111*a*. The first bottom plate 112 may be, for example, a plate-like member having a rectangular shape. An opening 112*h* having, for example, a circular shape that is larger than an outer diameter of the cover 140 is formed in the vicinity of the center portion of the first bottom plate 112.

The second bottom plate 113 is attached to a left side surface of the frame 111 so as to protrude outward from the frame 111. The second bottom plate 113 may be, for example, a plate-like member having a rectangular shape. The second bottom plate 113 may be integrally formed with the first bottom plate 112.

The side plate 114 is attached to the left side surface of the frame 111. The side plate 114 may be, for example, a plate-like member having a rectangular shape.

The positioning portion 115 is a portion connected to a carriage 500 (see FIGS. 13A to 13D) that mounts a cart 510 that supports the lower end portion of the reaction tube 34 and conveys to the assembling apparatus 100, and is formed, for example, on a front surface of the lower frame 111*a*. Meanwhile, the positioning portion 115 may be formed, for example, on a rear surface or a right side surface of the lower frame 111*a*. The positioning portion 115 has a function of positioning the assembling apparatus 100 and the carriage 500. The shape of the positioning portion 115 is not particularly limited, and may be capable of being connected with the carriage 500 and positioning the carriage 500.

The leg portion 116 is a support member that supports the assembling apparatus 100 from the lower side, and is attached to, for example, a lower surface of the four corners of the lower frame 111*a*. The leg portion 116 is configured to be stretchable. By expanding the leg portion 116, the assembling apparatus 100 is fixed to a surface to be provided, and by contracting the leg portion 116, the leg portion 116 is separated from the surface to be provided and the assembling apparatus 100 becomes movable by the caster 117.

The caster 117 is a member that movably supports the assembling apparatus 100 from the lower side, and is attached to, for example, the lower surface of the four corners of the lower frame 111*a*. The caster 117 is, for example, a clean room corresponding caster.

The slide mechanism 120 is attached to an upper surface of the first bottom plate 112. The slide mechanism 120 conveys the cart 510 that supports the lower end portion of the reaction tube 34 between the assembling apparatus 100 and the outside of the assembling apparatus 100. The slide mechanism 120 may be constituted by two guide rails 121 arranged to extend from the end portion surface where the positioning portion 115 is provided. A stopper 122 is provided at a guide rail 121. For example, in a case where the positioning portion 115 is formed on the front surface of the lower frame 111a, the slide mechanism 120 may be two guide rails arranged in parallel with the front-rear direction as the longitudinal direction. Further, for example, in a case where the positioning portion 115 is formed on the right side surface of the lower frame 111a, the slide mechanism 120 may be two guide rails arranged in parallel with the left-right direction as the longitudinal direction. The cart 510 moves in the front-rear direction on the guide rails 121 with four wheels provided respectively at the end portions in the left-right direction. Further, the structure of the slide mechanism 120 is not limited as long as the cart 510 is conveyable between the assembling apparatus 100 and the outside of the assembling apparatus 100. Further, for example, in a case where the cart 510 is conveyable between the assembling apparatus 100 and the outside of the assembling apparatus 100 while the cart 510 is held by a conveying arm, the slide mechanism 120 may not be provided.

The lifting mechanism 130 is attached to the body 110, and holds and moves the reaction tube 34 vertically. The lifting mechanism 130 is a double slider mechanism that includes two lifting units. The lifting mechanism 130 includes a guide portion 131, a first lifting unit 132, a second lifting unit 133, and an inclination adjusting mechanism 134.

The guide portion 131 guides the first lifting unit 132 and the second lifting unit 133 to be movable in the vertical direction. The guide portion 131 is formed to extend in the vertical direction, for example, from the lower frame 111a to the upper frame 111c. The guide portion 131 is attached to, for example, the lower frame 111a, the upper frame 111c, the reinforcing member 111d, and the side plate 114.

The first lifting unit 132 is attached to the guide portion 131 so as to move vertically, and is configured to hold the outer tube 46. The first lifting unit 132 includes a moving portion 132a that moves in the vertical direction while being guided by the guide portion 131 and a substantially annular plate-like holding portion 132b that is attached to the moving portion 132a and holds the outer tube 46 while surrounding the outer periphery of the outer tube 46.

The second lifting unit 133 is attached to the guide portion 132 below the first lifting unit 132 so as to move vertically, and is configured to hold the inner tube 44. The second lifting unit 133 includes a moving portion 133a that moves in the vertical direction while being guided by the guide portion 131 and a substantially circular plate-like holding portion 133b that is attached to the moving portion 133a and holds the lower end portion of the inner tube 44 from the lower side.

The inclination adjusting mechanism 134 is a mechanism that adjusts an inclination of the first lifting unit 132. The inclination adjusting mechanism 134 includes, for example, a rod-like member 134a flexible in length that is fixed to the moving portion 132a at one end portion, and fixed to the holding portion 132b at the other end portion, and an adjusting portion 134b that adjust the length of the rod-like member 134a. In this case, by shortening the rod-like member 134a by the adjusting portion 134b, the first lifting unit 132 is pulled upward such that the inclination of the first lifting unit 132 that is tilted downward is corrected. Further, by extending the rod-like member 134a by the adjusting portion 134b, the first lifting unit 132 is pushed downward such that the inclination of the first lifting unit 132 that is tilted upward is corrected. The inclination adjusting mechanism 134 may have another form as long as it is capable of adjusting the inclination of the first lifting unit 132. Further, the inclination adjusting mechanism 134 may not be provided, for example, in case where there is no possibility that the first lifting unit 132 is inclined.

The cover 140 is a member that air-tightly closes the opening at the lower end portion of the reaction tube 34. The cover 140 is provided below the guide rails 121. The cover 140 includes a plate-like member 141 having a circular plate shape that air-tightly closes the opening at the lower end portion of the reaction tube 34, and a gas port 142 (see FIGS. 16A and 16B) that is formed by penetrating the plate-like member 141. The gas port 142 is connected to a gas box 151 through an introducing pipe 152, and a gas is introduced into the reaction tube 34 through the gas port 142 from the gas box 151. Further, the gas port 142 is connected to an exhaust device 161 through an exhaust pipe 162, and the inside of the reaction tube 34 is exhausted by the exhaust device 161 through the exhaust pipe 162. The gas port 142 may include a supply port and an exhaust port. In this case, the supply port is connected to the gas box 151 through the introducing pipe 152, and the exhaust port is connected to the exhaust device 161 through the exhaust pipe 162.

The gas supply mechanism 150 supplies a gas into the reaction tube 34. The gas supply mechanism 150 includes the gas box 151, and the introducing pipe 152 (see FIGS. 16A and 16B). The gas box 151 is attached to the side plate 114 of the body 110. The gas box 151 mixes gases supplied from a plurality of gas supply source (not illustrated) and supplies the gas to the introducing pipe 152. The gas box 151 includes a case, a plurality of pipes, a plurality of valves, and a plurality of mass flow controllers. Devices such as the plurality of pipes, the plurality of valves, and the plurality of mass flow controllers are accommodated inside the case. The introducing pipe 152 is connected to a pipe of the gas box 151 at one end portion and is connected to the gas port 142 of the cover 140 at the other end portion, and introduces the gas supplied from the gas box 151 into the reaction tube 34 through the gas port 142 of the cover 140.

The exhaust mechanism 160 exhausts the inside of the reaction tube 34. The exhaust mechanism 160 includes the exhaust device 161 and the exhaust pipe 162. The exhaust device 161 is arranged on the second bottom plate 113 via a vibration isolation member 163 such as a vibration isolation gel or a vibration isolation pad. Since the exhaust device 161 is arranged on the second bottom plate 113 via the vibration isolation member 163, transmission of the vibration generated by the exhaust device 161 to, for example, the reaction tube 34 held by the lifting mechanism 130 is suppressed. The exhaust device 161 may be a vacuum pump such as, for example, a dry pump. The exhaust pipe 162 is connected to the gas port 142 of the cover 140 at one end portion and connected to the exhaust device 161 at the other end portion, and exhausts the inside of the reaction tube 34 through the gas port 142 and the exhaust pipe 162.

The controller 170 controls an operation of each component of the assembling apparatus 100. The controller 170 includes an electrical control panel 171 and an information terminal 172. The electrical control panel 171 is attached to, for example, the side plate 214 of the body 110 adjacent to the gas box 151. The information terminal 172 is attached to the electrical control panel 171. The information terminal 172 may be, for example, a terminal that receives an input of an operator, and displays various types of information.

Figure 7:
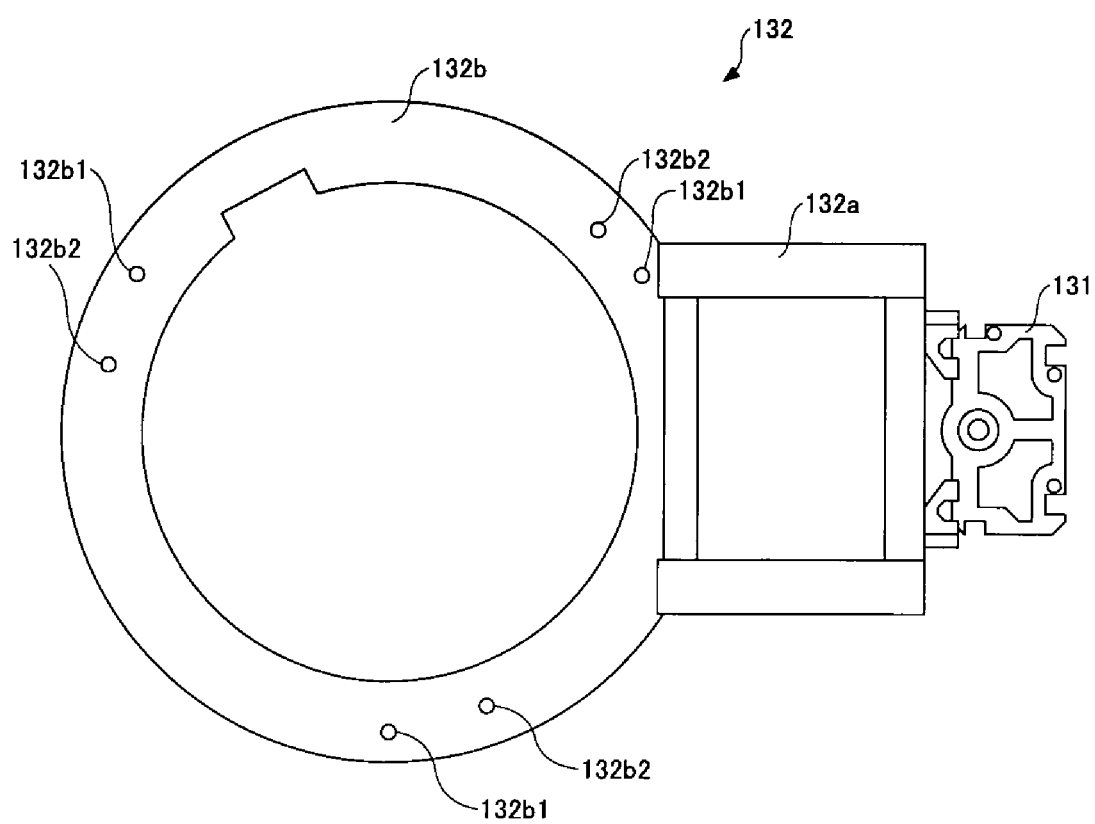
FIG. 7 is a plan view illustrating an exemplary configuration of a first lifting unit.

Subsequently, a specific example of the first lifting unit 132 of the lifting mechanism 130 will be described. FIG. 7 is a plan view illustrating an exemplary configuration of the first lifting unit 132.

As illustrated in FIG. 7, the first lifting unit 132 includes the moving portion 132a and the holding portion 132b.

The moving portion 132a moves in vertical direction while being guided by the guide portion 131.

The holding portion 132b is attached to the moving portion 132a. The holding portion 132b is formed in an annular plate shape that has an inner diameter larger than the outer diameter of the outer tube 46 to be held, and holds the outer tube 46 while surrounding the outer periphery of the outer tube 46. First connecting portions 132b1 and second connecting portions 132b2 are formed in the holding portion 132b. The first connecting portions 132b1 and the second connecting portions 132b2 are used for connecting with connecting portions formed in the flange portion 56 of the outer tube 46. The first connecting portions 132b1 and the second connecting portions 132b2 are formed at positions corresponding to the connecting portions (e.g., holes) formed in the flange portion 56 of the outer tube 46 having a different shape. As a result, even in a case of the outer tube 46 (flange portion 56) having a different shape, it is possible to hold the outer tube 46 without changing the first lifting unit 132. The first connecting portions 132b1 and the second connecting portions 132b2 are, for example, three holes respectively formed along the circumferential direction. The holes of the second connecting portions 132b2 are formed, for example, at positions and on circumferences different from the holes of the first connecting portions 132b1.

Figure 9:
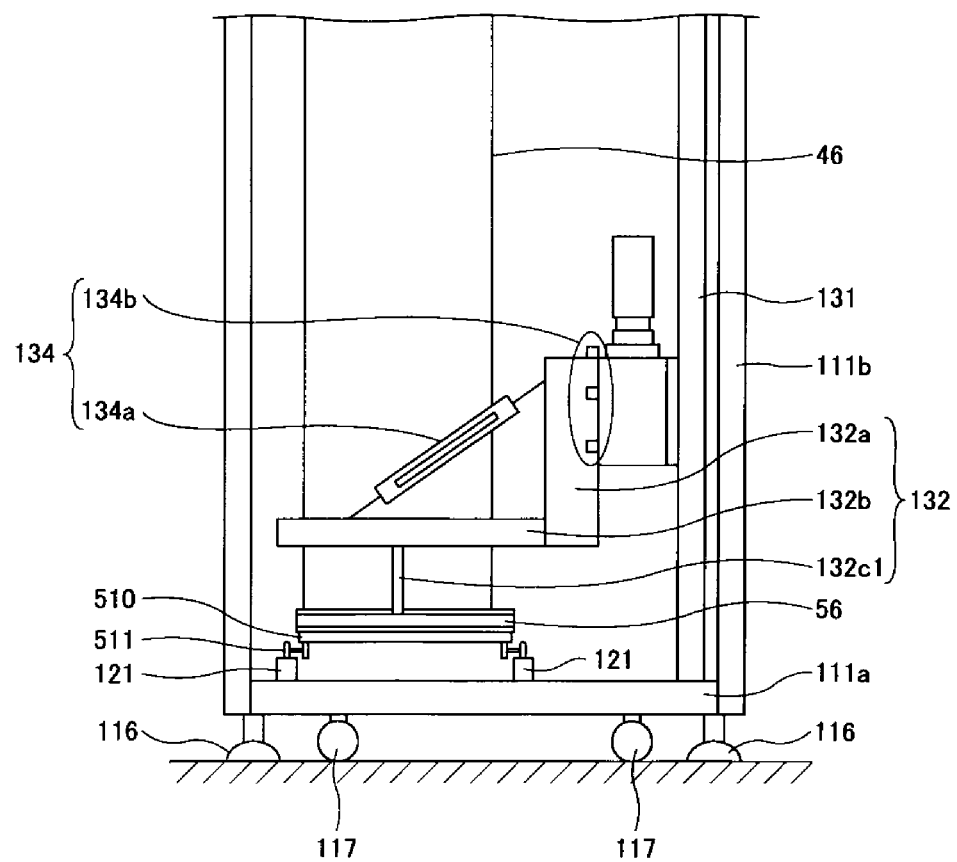
FIG. 9 is a side view illustrating a state where the first lifting unit holds the outer tube.

FIT. 8 is an explanatory view of a positional relationship between the first lifting unit 132 and the flange portion 56 of the manifold 54 attached to the outer tube 46. FIG. 9 is a side view illustrating a state where the first lifting unit 132 holds the outer tube 46.

Figure 8:
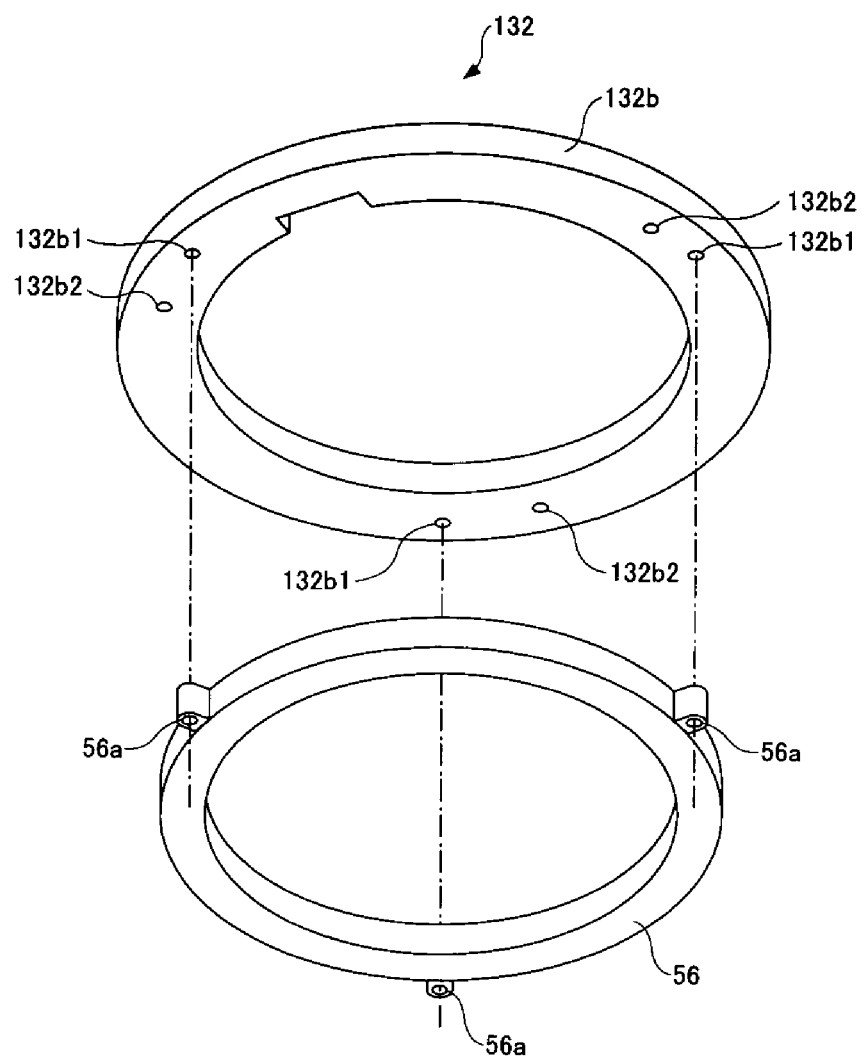
FIG. 8 is an explanatory view of a positional relationship between the first lifting unit and a flange portion of a manifold attached to an outer tube.

Three holes 56a that are formed to be protruded from the outer peripheral portion are formed as connecting portions in the flange portion 56 illustrated in FIG. 8. As illustrated in FIG. 8, the three holes of the first connecting portions 132b1 formed in the holding portion 132b of the first lifting unit 132 are formed at positions corresponding to the three holes 56a of the flange portion 56. As a result, as illustrated in FIG. 9, the holding portion 132b of the first lifting unit 132 and the flange portion 56 are brought into contact with each other, for example, screws 132c1 are inserted into the three holes of the first connecting portions 132b1 and the three holes 56a of the flange portion 56, and the distal ends of the screws 132c1 are fastened by bolts (not illustrated), and thus, the outer tube 46 is fixed to the first lifting unit 132. The method for fixing the outer tube 46 to the first lifting unit 132 is not limited thereto, but other methods may be used.

Figure 10:
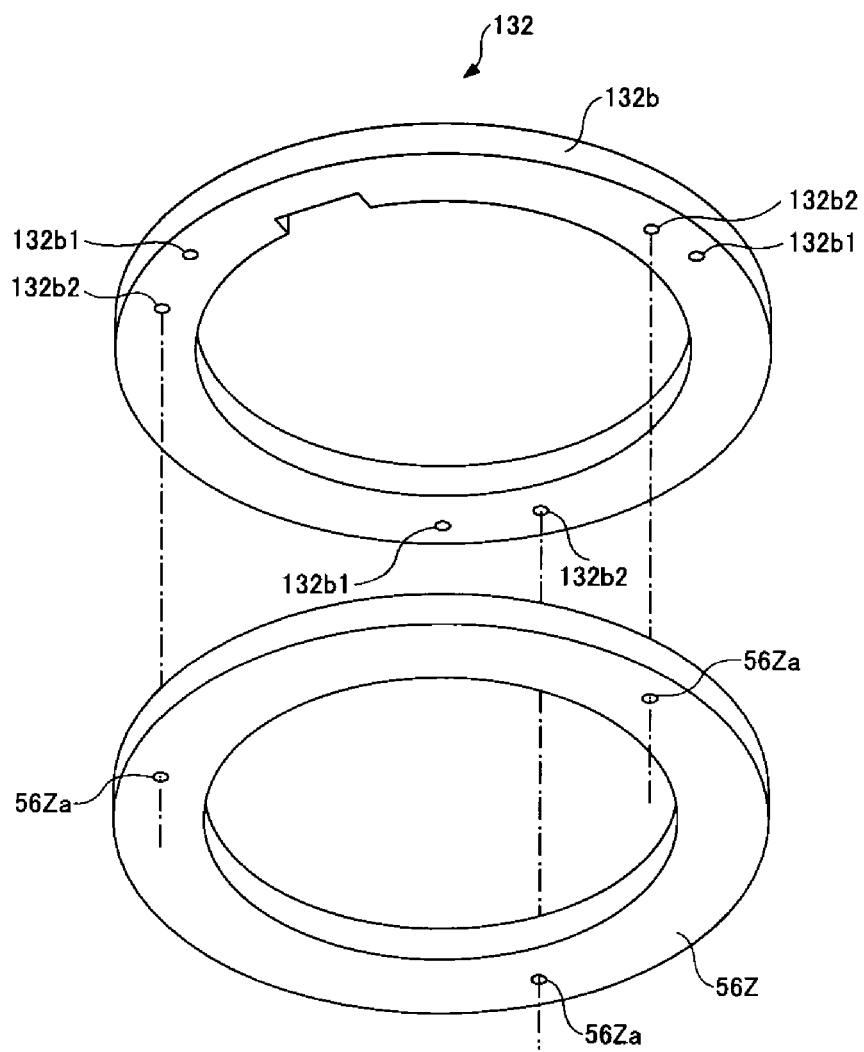
FIG. 10 is an explanatory view of a positional relationship between the first lifting unit and the flange portion of the manifold attached to the outer tube.
Figure 11:
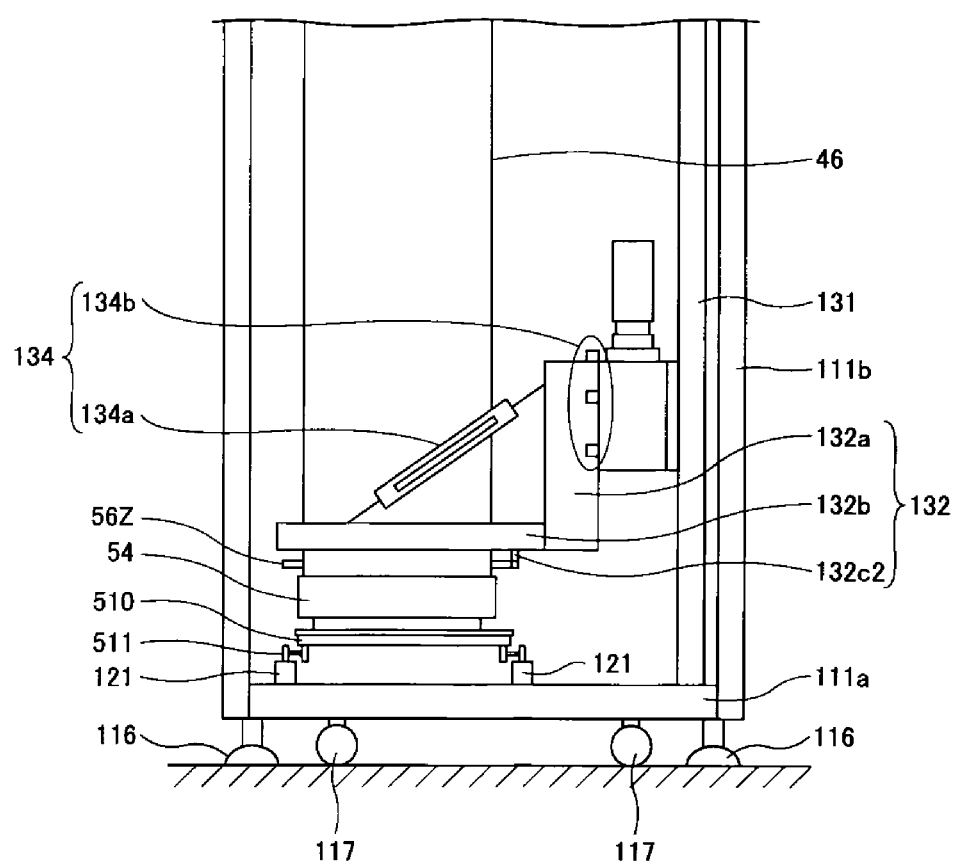
FIG. 11 is a side view illustrating a state where the first lifting unit holds the outer tube.

FIG. 10 is an explanatory view of a positional relationship between the first lifting unit 132 and a flange portion 56Z of the manifold 54 attached to the outer tube 46. FIG. 11 is a side view illustrating a state where the first lifting unit 132 holds the outer tube 46.

The flange portion 56Z illustrated in FIG. 10 has a shape different from the flange portion 56 illustrated in the example of FIG. 8. That is, three holes 56Za that are formed without being protruded from the outer periphery of the flange portion 56Z are formed as connecting portions in the flange portion 56Z. As illustrated in FIG. 10, the three holes of the second connecting portions 132b2 formed in the holding portion 132b of the first lifting unit 132 are formed at positions corresponding to the three holes 56Za of the flange portion 56Z. As a result, as illustrated in FIG. 11, the holding portion 132b of the first lifting unit 132 and the flange portion 56Z are brought into contact with each other, for example, screws 132c2 are inserted into the three holes of the second connecting portions 132b2 and the three holes 56Za of the flange portion 56Z, and the distal ends of the screws 132c2 are fastened by bolts (not illustrated), and thus, the outer tube 46 is fixed to the first lifting unit 132. The method for fixing the outer tube 46 to the first lifting unit 132 is not limited thereto, but other methods may be used.

In the above example, descriptions have been made on the case where the first connecting portions 132b1 and the second connecting portions 132b2 are formed in the holding portion 132b respectively as the connecting portions that are used for connecting with the flange portions 56 and 56Z. However, the present disclosure is not limited thereto. For example, one connecting portion or a plurality of connecting portions are formed in the holding portion 132b according to the shape of the outer tube (flange portion) to be held.

(Assembling Method for Semiconductor Manufacturing Apparatus)

Figure 12:
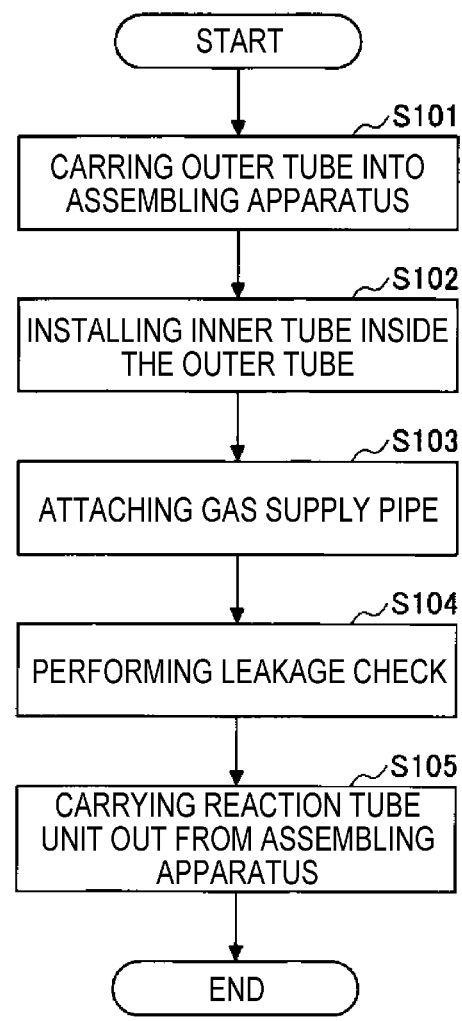
FIG. 12 is a flowchart illustrating an example of an assembling method for the semiconductor manufacturing apparatus according to the first embodiment.

As an example of an assembling method for the semiconductor manufacturing apparatus according to the first embodiment, a case where a reaction tube unit of a longitudinal heat treatment apparatus having a double tube structure is assembled by using the above assembling apparatus 100 will be described. FIG. 12 is a flowchart illustrating an example of an assembling method for the semiconductor manufacturing apparatus according to the first embodiment.

As illustrated in FIG. 12, the assembling method for the semiconductor manufacturing apparatus according to the first embodiment includes a step of carrying the outer tube 46 into the assembling apparatus 100 (S101), a step of installing the inner tube 44 inside the outer tube 46 (S102), a step of attaching a gas supply pipe (S103), a step of performing a leakage check (S104), and a step of carrying the reaction tube unit out from the assembling apparatus 100 (S105). Hereinafter, respective steps will be described.

FIGS. 13A to 13D are explanatory views for the carrying-in step S101 of the outer tube 46 to the assembling apparatus 100. In step S101, firstly, the outer tube 46 is conveyed to the assembling apparatus 100 by the carriage 500 that mounts the outer tube 46 supported by the cart 510 at its lower end portion (see FIG. 13A). The assembling apparatus 100 and the carriage 500 are positioned by connecting the distal end of the carriage 500 to the positioning portion 115 of the assembling apparatus 100. Guide rails 520 are provided on the carriage 500 to be connected to the guide rails 121 of the assembling apparatus 100 in a state of being positioned with the assembling apparatus 100. Subsequently, in a state where the first lifting unit 132 is evacuated above the height of the outer tube 46, the cart 510 is moved on the guide rails 520 of the carriage 500 and the guide rails 121 of the assembling apparatus 100 to carry the outer tube 46 into the assembling apparatus 100. Subsequently, the distal end of the carriage 500 is separated from the positioning portion 115 of the assembling apparatus 100 (see FIG. 13B). Subsequently, the first lifting unit 132 is moved downward from above the outer tube 46, and the outer tube 46 is held by the first lifting unit 132 (see FIG. 13C). Subsequently, the first lifting unit 132 is raised while holding the outer tube 46 such that the lower end portion of the outer tube 46 is above the height of the inner tube 44 (see FIG. 13D). Subsequently, the distal end of the empty carriage 500 where the cart 510 is not mounted on is connected to the positioning portion 115 of the assembling apparatus 100. Then, the empty cart 510 is carried out from the assembling apparatus 100 by moving the empty cart 510 that does not hold the outer tube 46 on the guide rails 121 of the assembling apparatus 100 and the guide rails 520 of the carriage 500.

FIGS. 14A to 14D are explanatory views for step S102 of attaching the inner tube 44 to the inside of the outer tube 46. In step S102, firstly, the inner tube 44 is conveyed to the assembling apparatus 100 by the carriage 500 that mounts the inner tube 44 supported by the cart 510 at its lower end portion (see FIG. 14A). The assembling apparatus 100 and the carriage 500 are positioned by connecting the distal end of the carriage 500 to the positioning portion 115 of the assembling apparatus 100. Subsequently, in a state where the second lifting unit 133 is evacuated below the guide rails 121, the cart 510 is moved on the guide rails 520 of the carriage 500 and the guide rails 121 of the assembling apparatus 100 to carry into the assembling apparatus 100. Subsequently, the distal end of the carriage 500 is separated from the positioning portion 115 of the assembling apparatus 100 (see FIG. 14B). Subsequently, the second lifting unit 133 is moved upward from below the inner tube 44, and the inner tube 44 is held by the second lifting unit 133 (see FIG. 14C). Subsequently, the inner tube 44 is accommodated and attached to the inside of the outer tube 46 by lowering the first lifting unit 132 that holds the outer tube 46, and further, raising the second lifting unit 133 that holds the inner tube 44 (see FIG. 14D). The inner tube 44 may be accommodated and attached to the inside of the outer tube 46 by raising the second lifting unit 133 that holds the inner tube 44 while the first lifting unit 132 that holds the outer tube 46 is fixed. Meanwhile, it may be desired that the first lifting unit 132 that holds the outer tube 46 is lowered, and further, the second lifting unit 133 that holds the inner tube 44 is raised. As a result, in the operation of attaching the inner tube 44 accommodated inside the outer tube 46 to the outer tube 46, or in an operation of attaching the gas supply pipe or a temperature sensor to the reaction tube 34 in step S103 of attaching the gas supply pipe, operations at high places are unnecessary, and workability is improved.

FIGS. 15A to 15C are explanatory views for step S103 of attaching the gas supply pipe. In step S103, firstly, the lower end portion of the reaction tube 34 is opened by moving the second lifting unit 133 downward from the position (see FIG. 15A) where the second lifting unit 133 was holding the inner tube 44 so as to evacuate it. Subsequently, a gas supply pipe NZ and a temperature sensor TC are inserted (see FIG. 15B) to the inside of the reaction tube 34 from the opening at the lower end portion of the reaction tube 34, and the gas supply pipe NZ and the temperature sensor TC are attached to the reaction tube 34 (see FIG. 15C). As a result, the reaction tube unit U is formed. The gas supply pipe NZ corresponds to, for example, the gas supply pipes 76, 78, and 80 of the longitudinal heat treatment apparatus 1 illustrated in FIG. 1. In a case where the temperature sensor TC is not attached to the inside of the reaction tube 34, the temperature sensor TC may not be attached. Further, in a case where other members to be attached to the inside of the reaction tube 34 are present, the other members may be attached in the attaching step S103 of the gas supply pipe NZ.

Figures 16A, 16B:
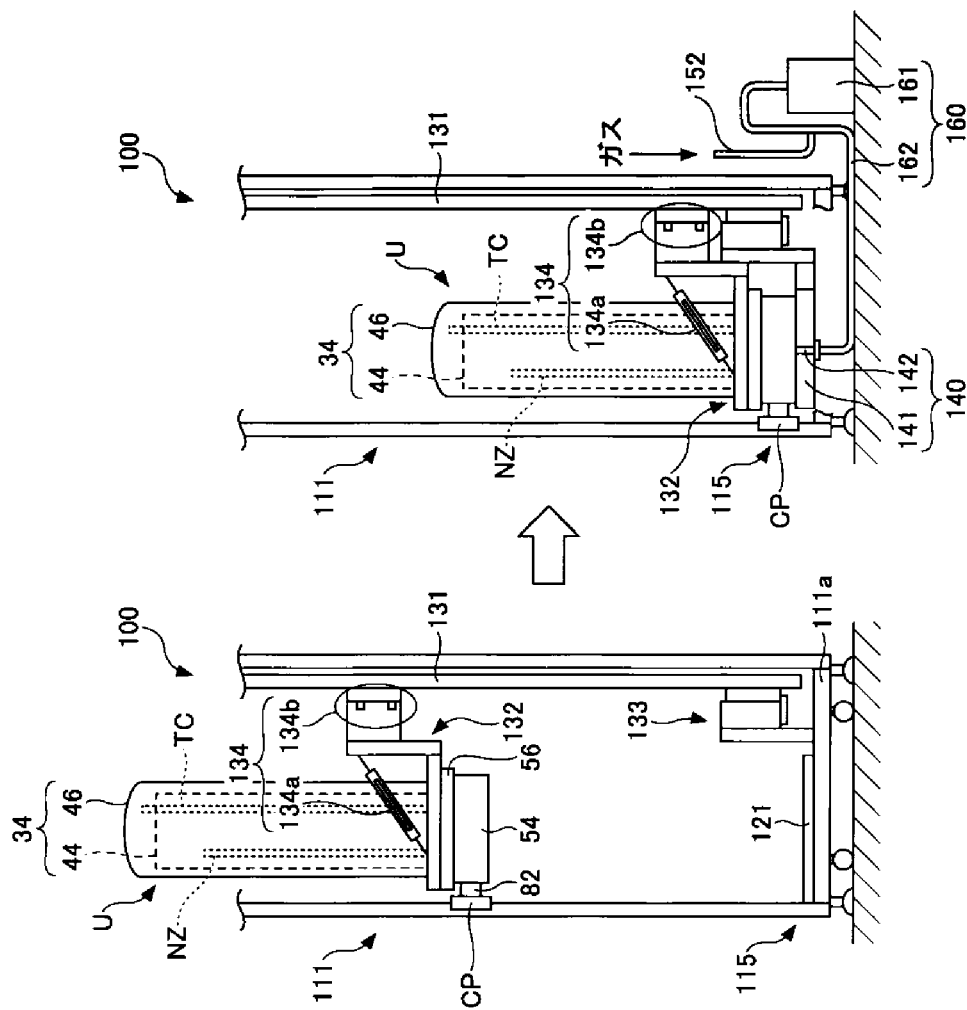
FIGS. 16A and 16B are explanatory views for a step of performing a leakage check.

FIGS. 16A and 16B are explanatory views for step S104 of performing the leakage check. In FIG. 16B, for convenience of explanation, the lower frame 111a is not illustrated. In step S104, firstly, a cover CP is attached to the gas outlet 82 of the outer tube 46 so as to air-tightly close the gas outlet 82 (see FIG. 16A). Subsequently, by lowering the first lifting unit 132, the opening at the lower end portion of the reaction tube 34 is air-tightly closed by the cover 140 provided below the lower frame 111a (see FIG. 16B). Subsequently, the leakage check for the inside of the reaction tube 34 is performed while exhausting the inside of the reaction tube 34 through the exhaust pipe 162 and the gas port 142 of the cover 140, by the exhaust device 161. A method for the leakage check is not particularly limited, but may be, for example, a helium leak test method (JISZ2331), or a leak test method (JISZ2332) based on pressure change such as a build-up method.

FIGS. 17A to 17C are explanatory views for step S105 of carrying the reaction tube unit U out from the assembling apparatus 100. In step S105, firstly, the lower end portion of the reaction tube 34 is separated from the cover 140 by raising the first lifting unit 132, and the empty cart 510 is carried onto the guide rails 121 of the assembling apparatus 100 (see FIG. 17A). Subsequently, the reaction tube unit U is placed on the cart 510 by lowering the first lifting unit 132 (see FIG. 17B). Subsequently, the distal end of the empty carriage 500 where the cart 510 is not mounted on is connected to the positioning portion 115 of the assembling apparatus 100. Then, the reaction tube unit U is carried out from the assembling apparatus 100 by moving the cart 510 that holds the reaction tube unit U on the guide rails 121 of the assembling apparatus 100 and the guide rails 520 on the carriage 500 (see FIG. 17C).

In this manner, the reaction tube unit U may be assembled. The assembled reaction tube unit U is conveyed to, for example, the place to be provided.

The assembling apparatus 100 described above includes the body 110, the lifting mechanism 130 that moves the inner tube 44 and the outer tube 46 vertically, the gas supply mechanism 150 that supplies the gas into the reaction tube 34, and the exhaust mechanism 160 that exhausts the inside of the reaction tube 34. According to the assembling apparatus 100 having this configuration, the reaction tube unit U may be assembled at a place different from a place where the longitudinal heat treatment apparatus is provided, and thus, it is easy to secure an operation space. As a result, since a plurality of operators may simultaneously perform the assembling operation of the reaction tube unit U, it is possible to reduce an assembling work period of the longitudinal heat treatment apparatus. Further, since a plurality of operators may simultaneously perform maintenance of the reaction tube unit U, it is possible to reduce downtime of the longitudinal heat treatment apparatus.

Further, according to the assembling apparatus 100, the lifting mechanism 130 includes the first lifting unit 132 that moves the outer tube 46 vertically and the second lifting unit 133 that moves the inner tube 44 vertically, and each height of the outer tube 46 and the inner tube 44 may be arbitrarily adjusted by the first lifting unit 132 and the second lifting unit 133. As a result, the operation of attaching the inner tube 44 to the inside of the outer tube 46, or the operation of attaching the gas supply pipe NZ or the temperature sensor TC to the reaction tube 34 may be performed at arbitrarily heights. Therefore, operations at high places are unnecessary, and workability is improved.

Further, according to the assembling apparatus 100, the inside of the reaction tube 34 may be exhausted through the gas port 142 formed by penetrating the plate-like portion of the cover 140, in a state where the opening at the lower end portion of the reaction tube 34 is air-tightly closed by the cover 140. As a result, the leakage check for the inside of the reaction tube 34 may be performed in the assembling step of the reaction tube unit U. Therefore, even if a leakage is found at the inside of the reaction tube 34, the reaction tube unit U may be easily reassembled by using the assembling apparatus 100.

Further, according to the assembling apparatus 100, since the inside of the reaction tube 34 is exhausted through the gas port 142 formed by penetrating the plate-like portion of the cover 140, it is unnecessary to perform a detaching operation of the exhaust pipe with respect to the gas port of the reaction tube 34. As a result, the risk of breakage of the reaction tube 34 may be reduced.

Second Embodiment (Assembling Apparatus for Semiconductor Manufacturing Apparatus)

An assembling apparatus according to a second embodiment is a single slider mechanism in which a lifting mechanism has one lifting unit, and is different from the assembling apparatus according to the first embodiment in that a body has a flange fixing portion that fixes and holds an outer tube.

The assembling apparatus according to the second embodiment is an apparatus for assembling a reaction tube unit by attaching a plurality of components of a batch type longitudinal heat treatment apparatus that performs a heat treatment on a plural number of wafers at once. The components are, for example, a reaction tube, a gas introducing pipe, and a heat retention pedestal. The reaction tube may be a single tube structure, or a double tube structure having an inner tube and an outer tube. According to the assembling apparatus according to the second embodiment, the reaction tube unit may be assembled at a place different from a place where the longitudinal heat treatment apparatus is provided, and thus, it is easy to secure an operation space. As a result, since a plurality of operators may simultaneously perform the assembling operation of the reaction tube unit, it is possible to reduce an assembling work period of the longitudinal heat treatment apparatus. Further, since a plurality of operators may simultaneously perform maintenance of the reaction tube unit, it is possible to reduce downtime of the longitudinal heat treatment apparatus.

Figure 18:
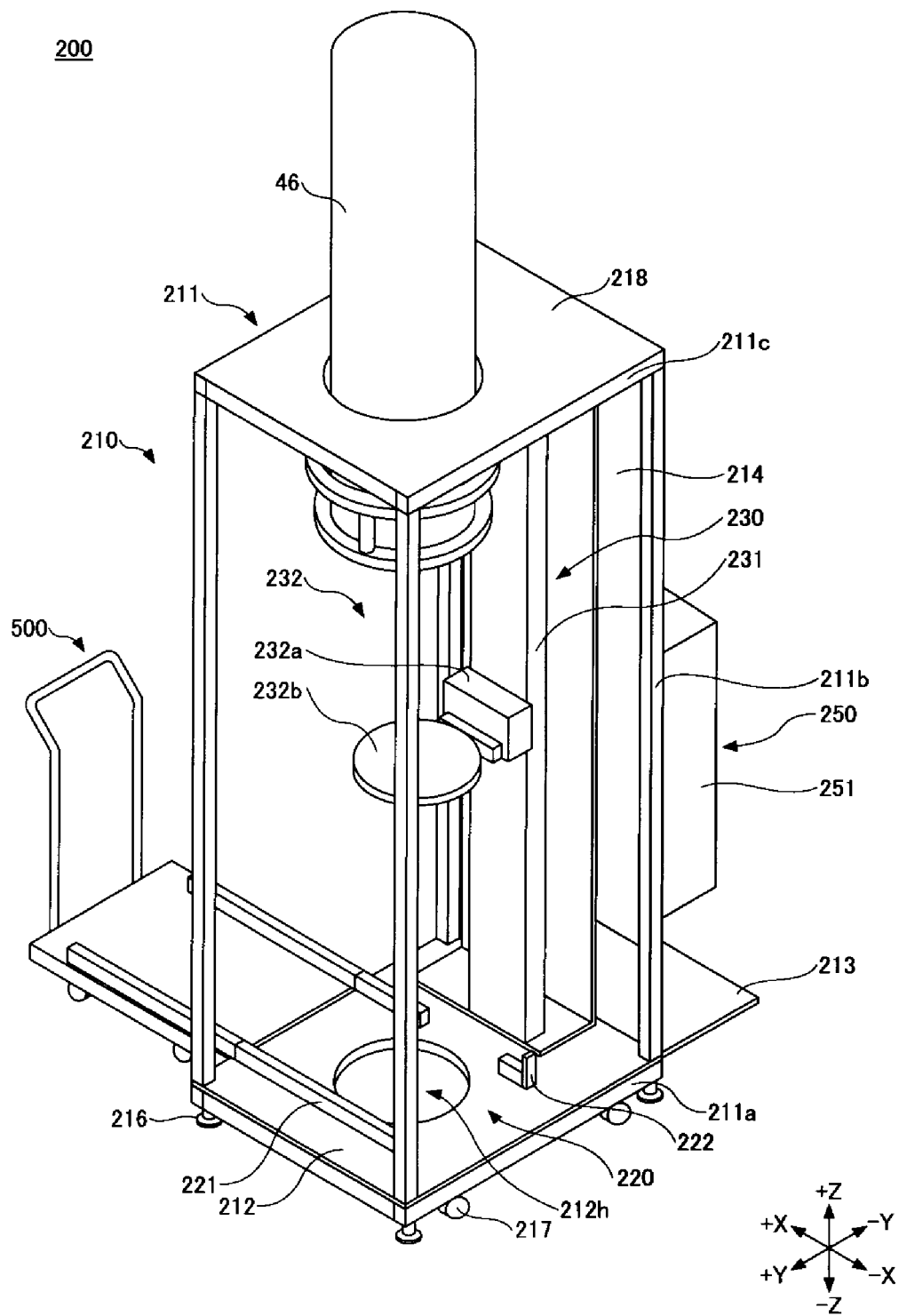
FIG. 18 is a perspective view (1) illustrating an exemplary configuration of an assembling apparatus according to a second embodiment.
Figure 19:
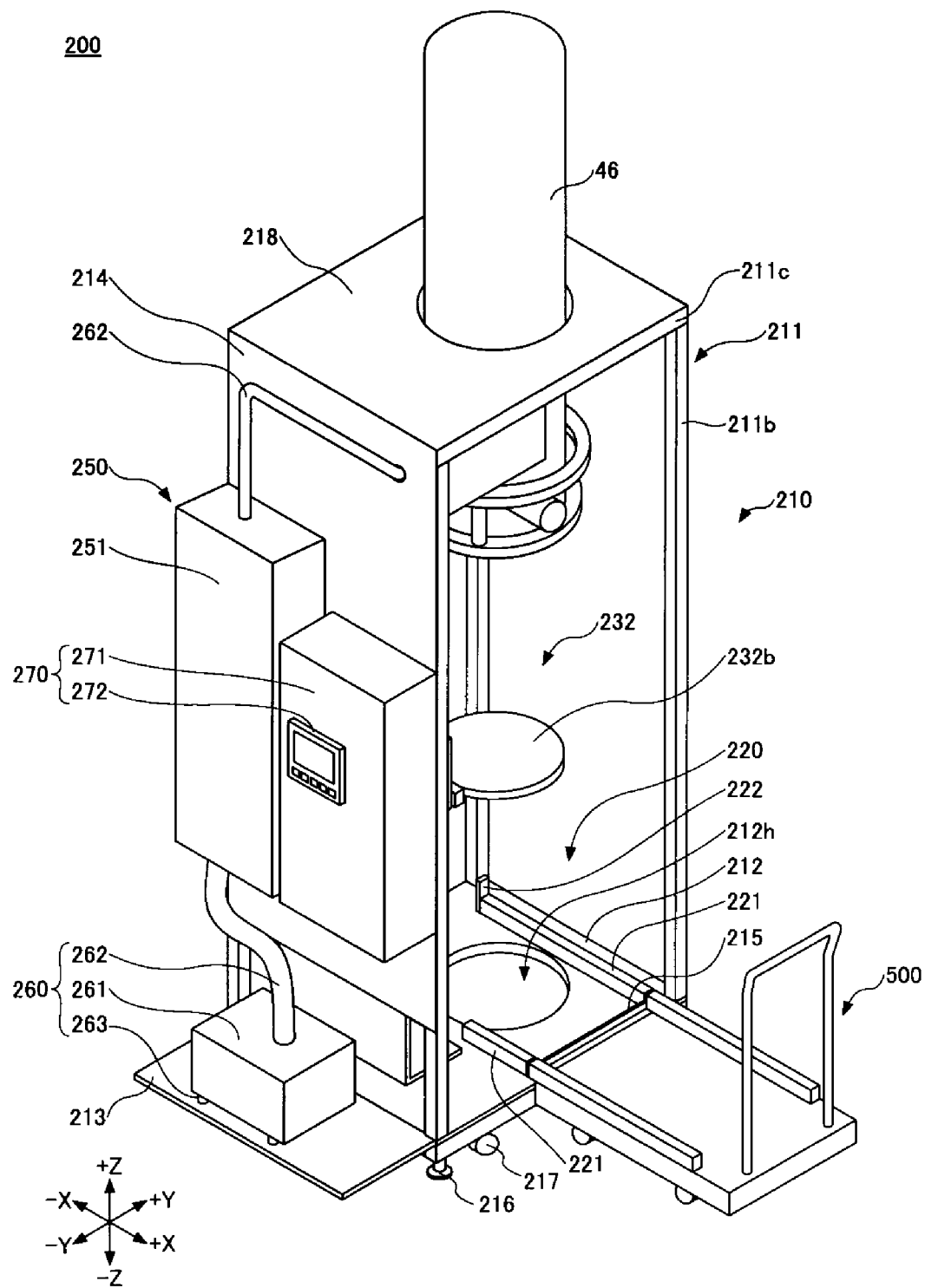
FIG. 19 is a perspective view (2) illustrating the exemplary configuration of the assembling apparatus according to the second embodiment.
Figure 20:
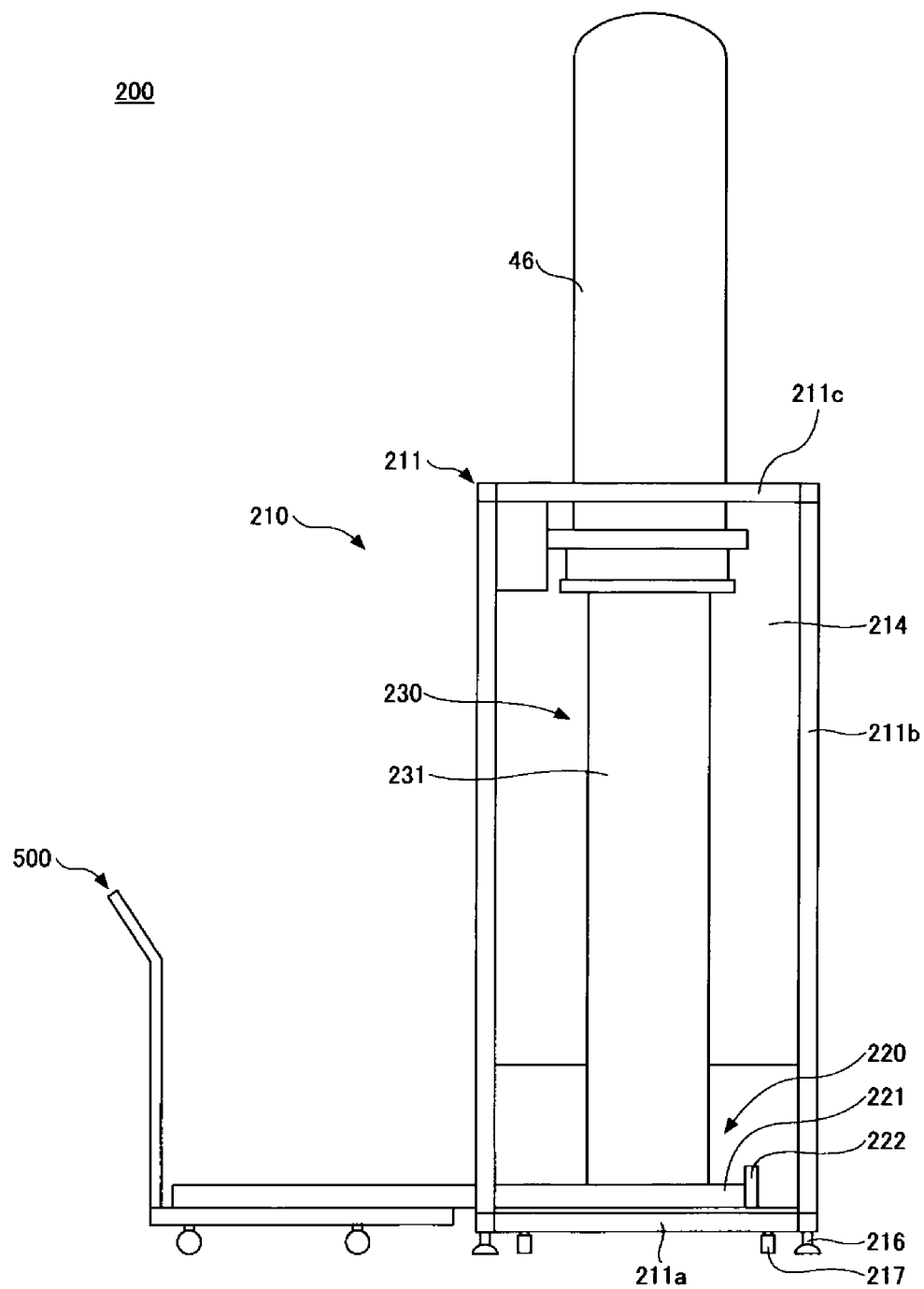
FIG. 20 is a side view (1) illustrating the exemplary configuration of the assembling apparatus according to the second embodiment.
Figure 21:
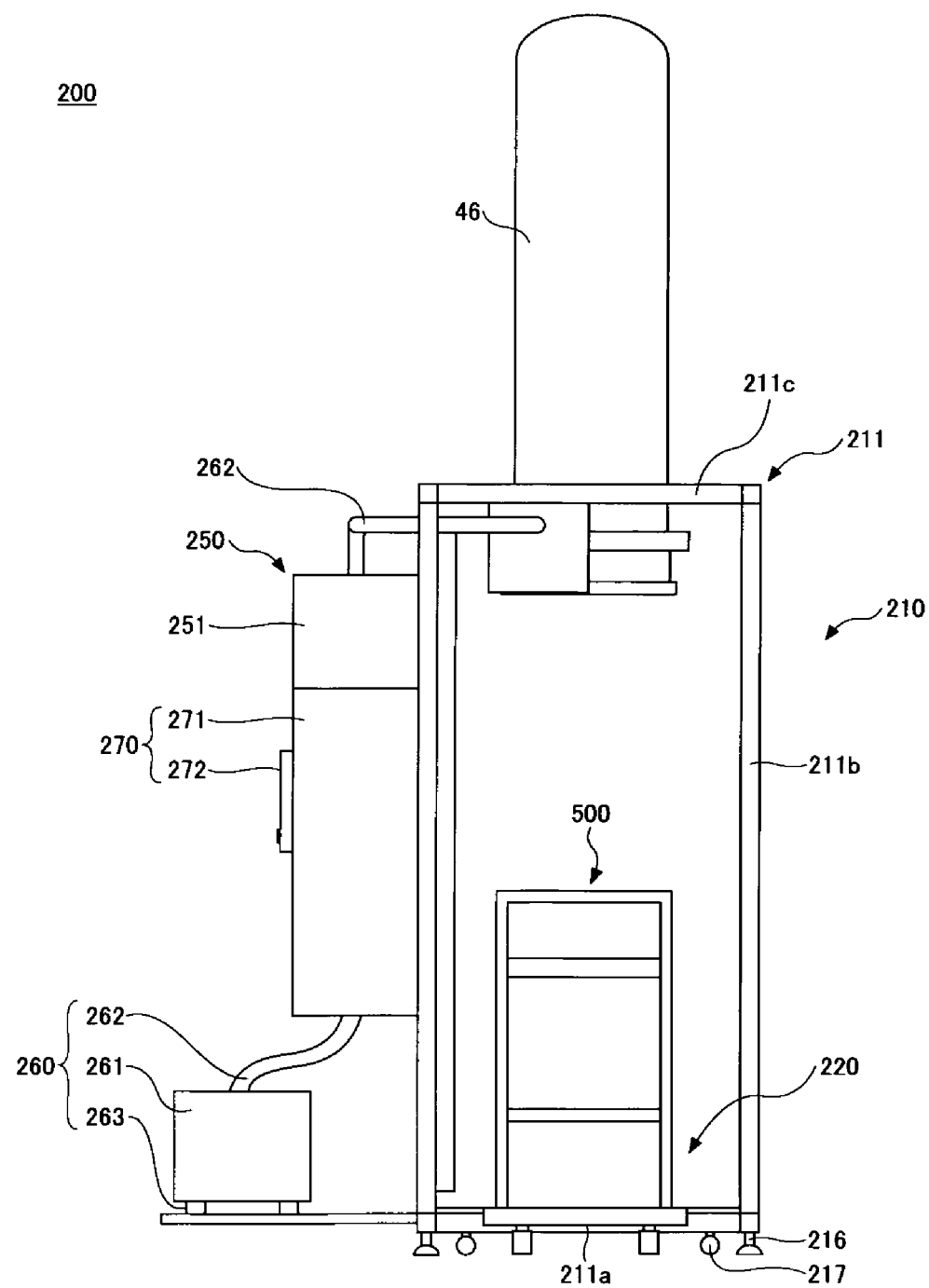
FIG. 21 is a side view (2) illustrating the exemplary configuration of the assembling apparatus according to the second embodiment.
Figure 22:
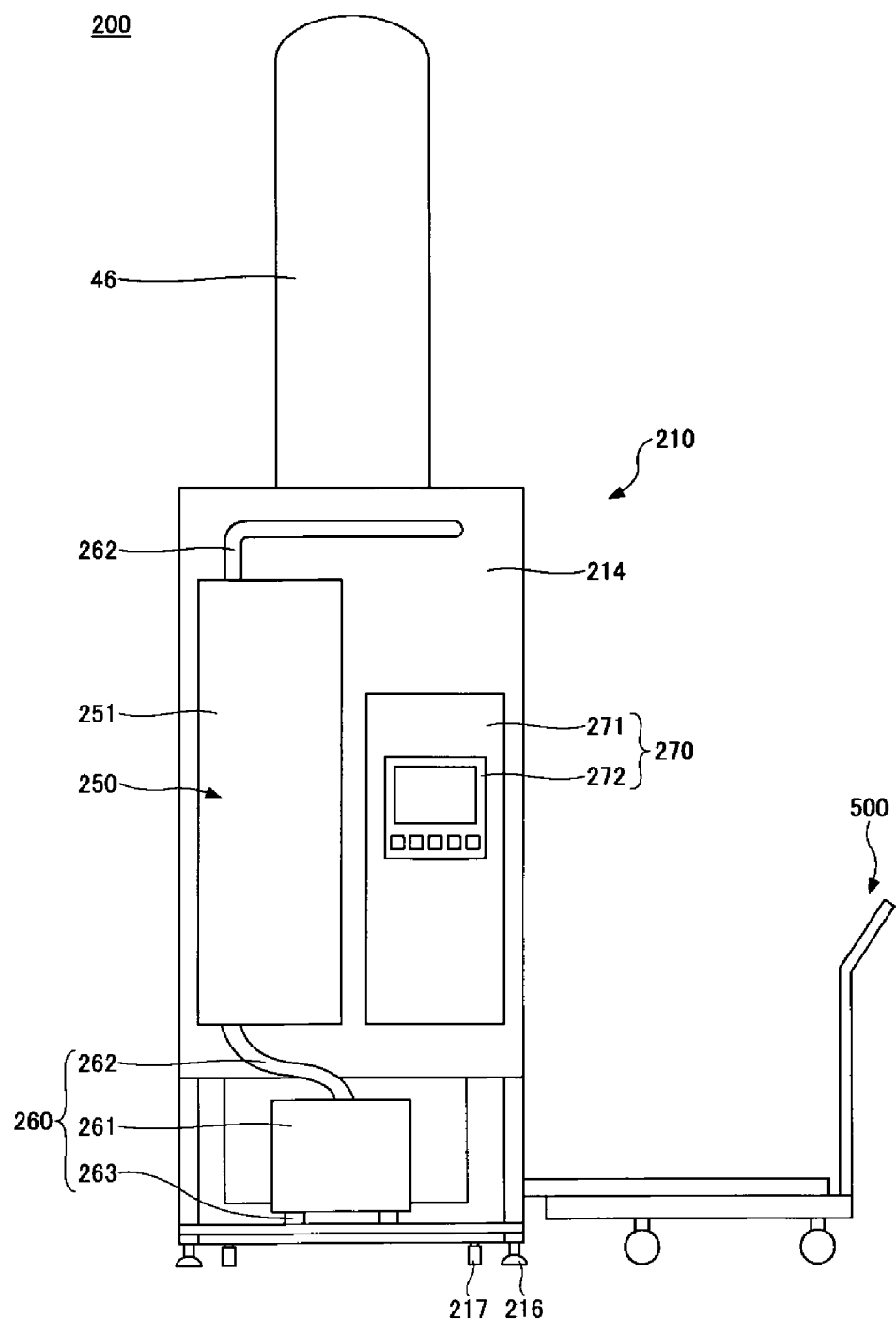
FIG. 22 is a side view (3) illustrating the exemplary configuration of the assembling apparatus according to the second embodiment.
Figure 23:
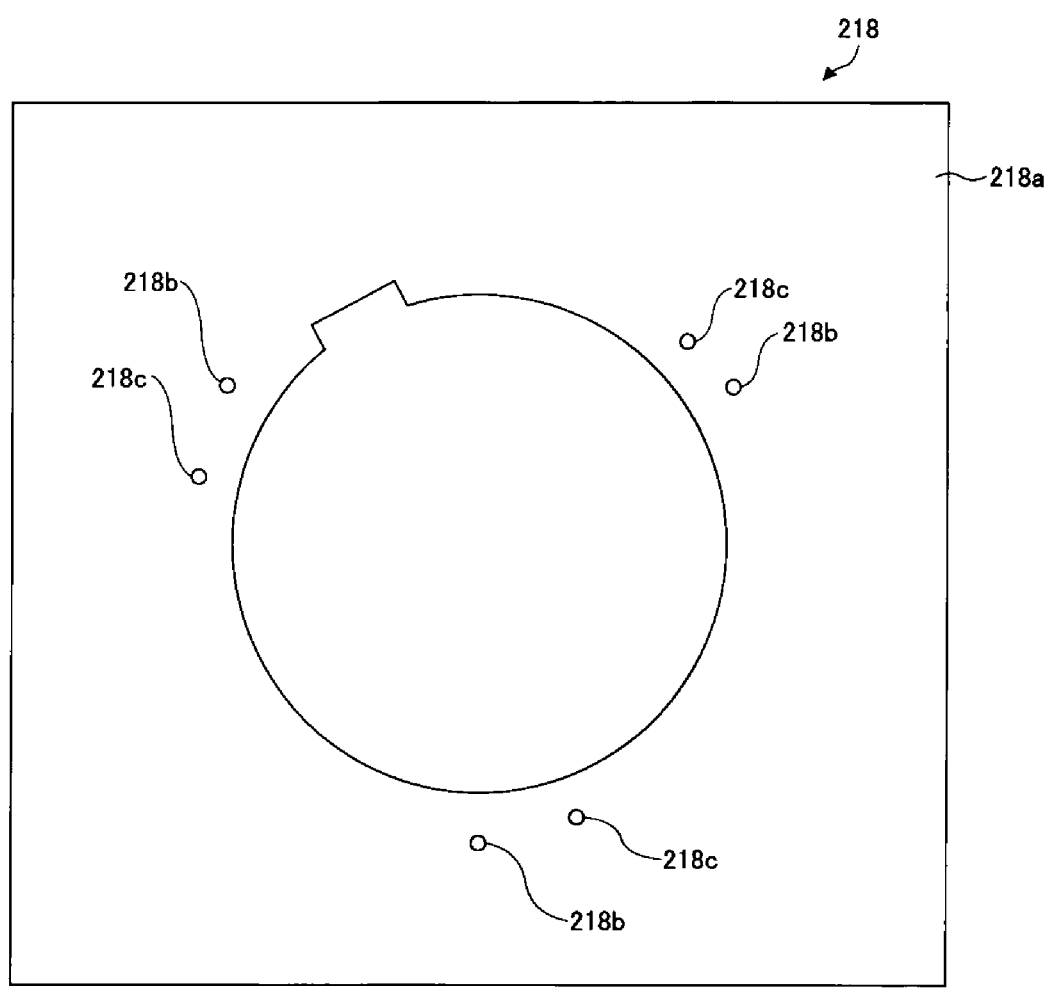
FIG. 23 is an explanatory view for a flange fixing portion of the assembling apparatus.
Figure 24:
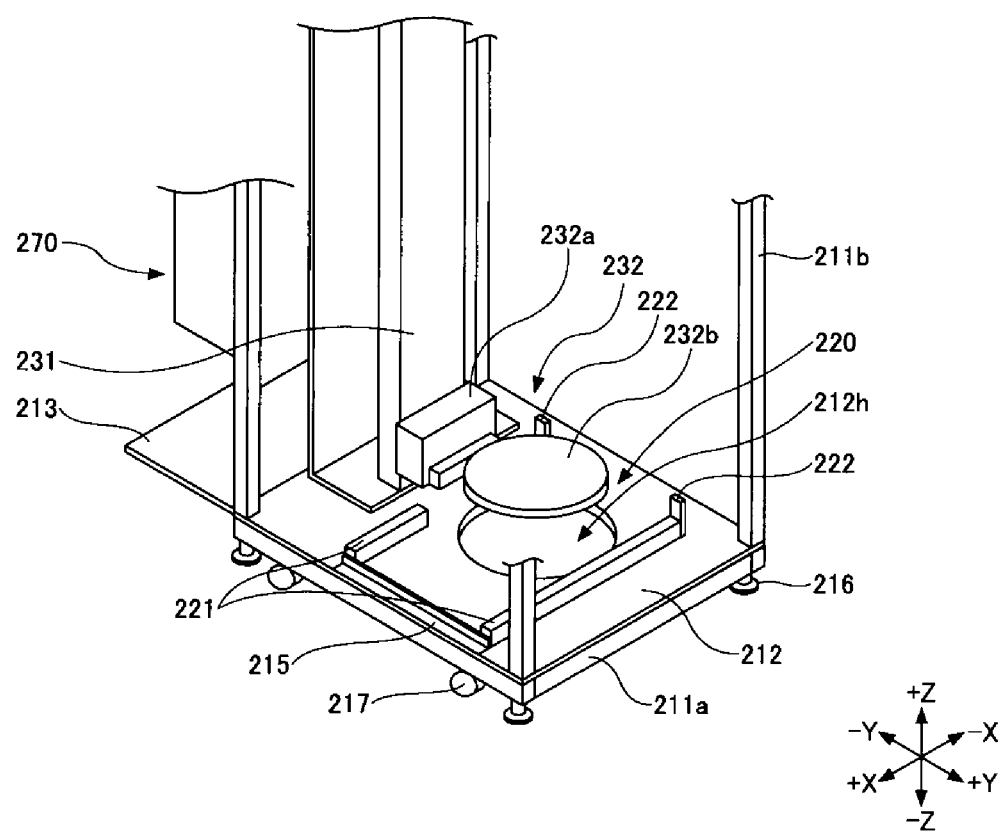
FIG. 24 is an enlarged perspective view of a portion of the assembling apparatus.

Hereinafter, an exemplary configuration of the assembling apparatus according to the second embodiment will be described. FIGS. 18 and 19 are perspective views illustrating the exemplary configuration of the assembling apparatus according to the second embodiment, and each drawing is a view illustrating a state viewed from a different viewpoint. Hereinafter, for convenience of explanation, in FIGS. 18 and 19, it will be described by assuming that +X direction is a front direction, −X direction is a rear direction, +Y direction is a right direction, −Y direction is a left direction, +Z direction is an upward direction, and −Z direction is a downward direction. Further, FIGS. 20 to 22 are side views illustrating an exemplary configuration of the assembling apparatus according to the second embodiment, and FIG. 20 illustrates a right side surface, FIG. 21 illustrates a front surface, and FIG. 22 illustrates a left side surface. FIG. 23 is an explanatory view of the flange fixing portion of the assembling apparatus, when viewed from above the flange fixing portion. FIG. 24 is an enlarged perspective view of a portion of the assembling apparatus. Further, in FIGS. 18 to 22, a state where the assembling apparatus holds the reaction tube is illustrated.

As illustrated in FIGS. 18 to 22, an assembling apparatus 200 includes a body 210, a slide mechanism 220, a lifting mechanism 230, a gas supply mechanism 250, an exhaust mechanism 260, and a controller 270.

The body 210 includes a frame 211, a first bottom plate 212, a second bottom plate 213, a side plate 214, a positioning portion 215, a leg portion 216, a caster 218, and a flange fixing portion 218. The frame 211, the first bottom plate 212, the second bottom plate 213, and the side plate 214 form a box-like appearance that constitutes a case.

The frame 211 includes a lower frame 211a, a column 211b, and an upper frame 211c. The lower frame 211a is formed, for example, by connecting four aluminum frames in a rectangular shape. The column 211b is formed of, for example, four aluminum frames that extend upward in parallel with each other from 4 corners of the lower frame 211a. The upper frame 211c is formed, for example, by connecting four aluminum frames in a rectangular shape, and is connected to an upper end portion of the column 211b. Further, the frame 211 may have a reinforcing member that connects and reinforces the aluminum frames, separately from the lower frame 211a, the column 211b, and the upper frame 211c.

The first bottom plate 212 is attached to an upper surface of the lower frame 211a. The first bottom plate 212 may be, for example, a plate-like member having a rectangular shape. An opening 212h having, for example, a circular shape that is larger than an outer diameter of a holding portion 232b is formed in the vicinity of the center portion of the first bottom plate 212.

The second bottom plate 213 is attached to a left side surface of the frame 211 so as to protrude outward from the frame 211. The second bottom plate 213 may be, for example, a plate-like member having a rectangular shape. The second bottom plate 213 may be integrally formed with the first bottom plate 212.

The side plate 214 is attached to the left side surface of the frame 211. The side plate 214 may be, for example, a plate-like member having a rectangular shape.

The positioning portion 215 is a portion connected to a carriage 500 that mounts a cart 510 that supports the lower end portion of the reaction tube 34 and conveys to the assembling apparatus 200, and is formed, for example, on a front surface of the lower frame 211a. Meanwhile, the positioning portion 215 may be formed, for example, on a rear surface or a right side surface of the lower frame 211a. The positioning portion 215 has a function of positioning the assembling apparatus 200 and the carriage 500. The shape of the positioning portion 215 is not particularly limited, and may be capable of being connected with the carriage 500 and positioning the carriage 500.

The leg portion 216 is a support member that supports the assembling apparatus 200 from the lower side, and is attached to, for example, a lower surface of the four corners of the lower frame 211a. The leg portion 216 is configured to be stretchable. By expanding the leg portion 216, the assembling apparatus 200 is fixed to a surface to be provided, and by contracting the leg portion 216, the leg portion 216 is separated from the surface to be provided and the assembling apparatus 200 becomes movable by the caster 217.

The caster 217 is a member that movably supports the assembling apparatus 200 from the lower side, and is attached to, for example, the lower surface of the four corners of the lower frame 211a. The caster 217 is, for example, a clean room corresponding caster 217.

The flange fixing portion 218 is a portion that fixes and holds the outer tube 46 lifted by the lifting mechanism 230. As illustrated in FIG. 23, the flange fixing portion 218 includes a plate-like portion 218a, third connecting portions 218b, and fourth connecting portions 218c. The plate-like portion 218a is attached to the upper frame 211c. The third connecting portions 218b and the fourth connecting portions 218c are used for connecting with connecting portions formed in the flange portion 56 of the outer tube 46. The third connecting portions 218b and the fourth connecting portions 218c are formed at positions corresponding to the connecting portions formed in the flange portion 56 of the manifold 54 attached to the outer tube 46 having a different shape. As a result, even in a case of the outer tube 46 having a different shape, it is possible to hold the outer tube 46 without changing the flange fixing portion 218. The third connecting portions 218b and the fourth connecting portions 218c are three holes respectively formed along the circumferential direction, similarly to the first connecting portions 132b1 and the second connecting portions 132b2 respectively described with reference to FIG. 7. The holes of the fourth connecting portions 218c are formed, for example, at positions and on circumferences different from the holes of the third connecting portions 218b.

The slide mechanism 220 is attached to an upper surface of the first bottom plate 212. The slide mechanism 220 conveys the cart 510 that supports the lower end portion of the reaction tube 34 between the assembling apparatus 200 and the outside of the assembling apparatus 200. The slide mechanism 220 may be two guide rails 221 arranged to extend from the end portion surface of the frame 211 where the positioning portion 215 is provided. A stopper 222 is provided at a guide rail 221. For example, in a case where the positioning portion 215 is formed on the front surface of the lower frame 211a, the slide mechanism 220 may be two guide rails arranged in parallel with the front-rear direction as the longitudinal direction. Further, for example, in a case where the positioning portion 215 is formed on the right side surface of the lower frame 211a, the slide mechanism 220 may be two guide rails arranged in parallel with the left-right direction as the longitudinal direction. The cart 510 moves in the front-rear direction on the guide rails 221 with four wheels provided respectively at the end portions in the left-right direction (see FIGS. 27A to 27C). Further, the structure of the slide mechanism 220 is not limited as long as the cart 510 is conveyable between the assembling apparatus 200 and the outside of the assembling apparatus 200. Further, for example, in a case where the cart 510 is conveyable between the assembling apparatus 200 and the outside of the assembling apparatus 200 while the cart 510 is held by a conveying arm, the slide mechanism 220 may not be provided.

The lifting mechanism 230 is attached to the body 210, and holds and moves the reaction tube 34 vertically. The lifting mechanism 230 is a single slider mechanism that includes one lifting unit. The lifting mechanism 230 may be, for example, a boat elevator. The lifting mechanism 230 includes a guide portion 231 and a lifting unit 232.

The guide portion 231 guides the lifting unit 232 to be movable in the vertical direction. The guide portion 231 is formed to extend in the vertical direction, for example, from the lower frame 211a to the upper frame 211c. The guide portion 231 is attached to, for example, the lower frame 211a, the upper frame 211c, and the side plate 214.

The lifting unit 232 is attached to the guide portion 231 so as to move vertically, and is configured to hold the inner tube 44 and the outer tube 46. The lifting unit 232 includes a moving portion 232a that moves in the vertical direction while being guided by the guide portion 231 and a substantially circular plate-like holding portion 232b that is attached to the moving portion 232a and holds the lower end portion of the inner tube 44 and the outer tube 46 from the lower side. The holding portion 232b functions as a cover that air-tightly closes the opening at the lower end portion of the reaction tube 34.

The gas supply mechanism 250 supplies a gas into the reaction tube 34. The gas supply mechanism 250 includes a gas box 251, and an introducing pipe (not illustrated). The gas box 251 is attached to the side plate 214 of the body 210. The gas box 251 mixes gases supplied from a plurality of gas supply source (not illustrated) and supplies the gas to the introducing pipe. The gas box 251 includes a case, a plurality of pipes, a plurality of valves, and a plurality of mass flow controllers. Devices such as the plurality of pipes, the plurality of valves, and the plurality of mass flow controllers are accommodated inside the case. The introducing pipe is connected to a pipe of the gas box 251 at one end portion and is connected to the inside of the reaction container at the other end portion, and introduces the gas supplied from the gas box 251 into the reaction tube 34.

The exhaust mechanism 260 exhausts the inside of the reaction tube 34. The exhaust mechanism 260 includes an exhaust device 261 and an exhaust pipe 262. The exhaust device 261 is arranged on the second bottom plate 213 via a vibration isolation member 263 such as a vibration isolation gel or a vibration isolation pad. Since the exhaust device 261 is arranged on the second bottom plate 213 via the vibration isolation member 263, transmission of the vibration generated by the exhaust device 261 to, for example, the reaction tube 34 held by the lifting mechanism 230 is suppressed. The exhaust device 261 may be a vacuum pump such as, for example, a dry pump. The exhaust pipe 262 is connected to the gas outlet 82 of the reaction tube 34 at one end portion and connected to the exhaust device 261 at the other end portion, and exhausts the inside of the reaction tube 34 through the gas outlet 82 and the exhaust pipe 262.

The controller 270 controls an operation of each component of the assembling apparatus 200. The controller 270 includes an electrical control panel 271 and an information terminal 272. The electrical control panel 271 is attached to the side plate 214 of the body 210 adjacent to the gas box 251. The information terminal 272 is attached to the electrical control panel 271. The information terminal 272 may be, for example, a terminal that receives an input of an operator, and displays various types of information.

Figure 25:
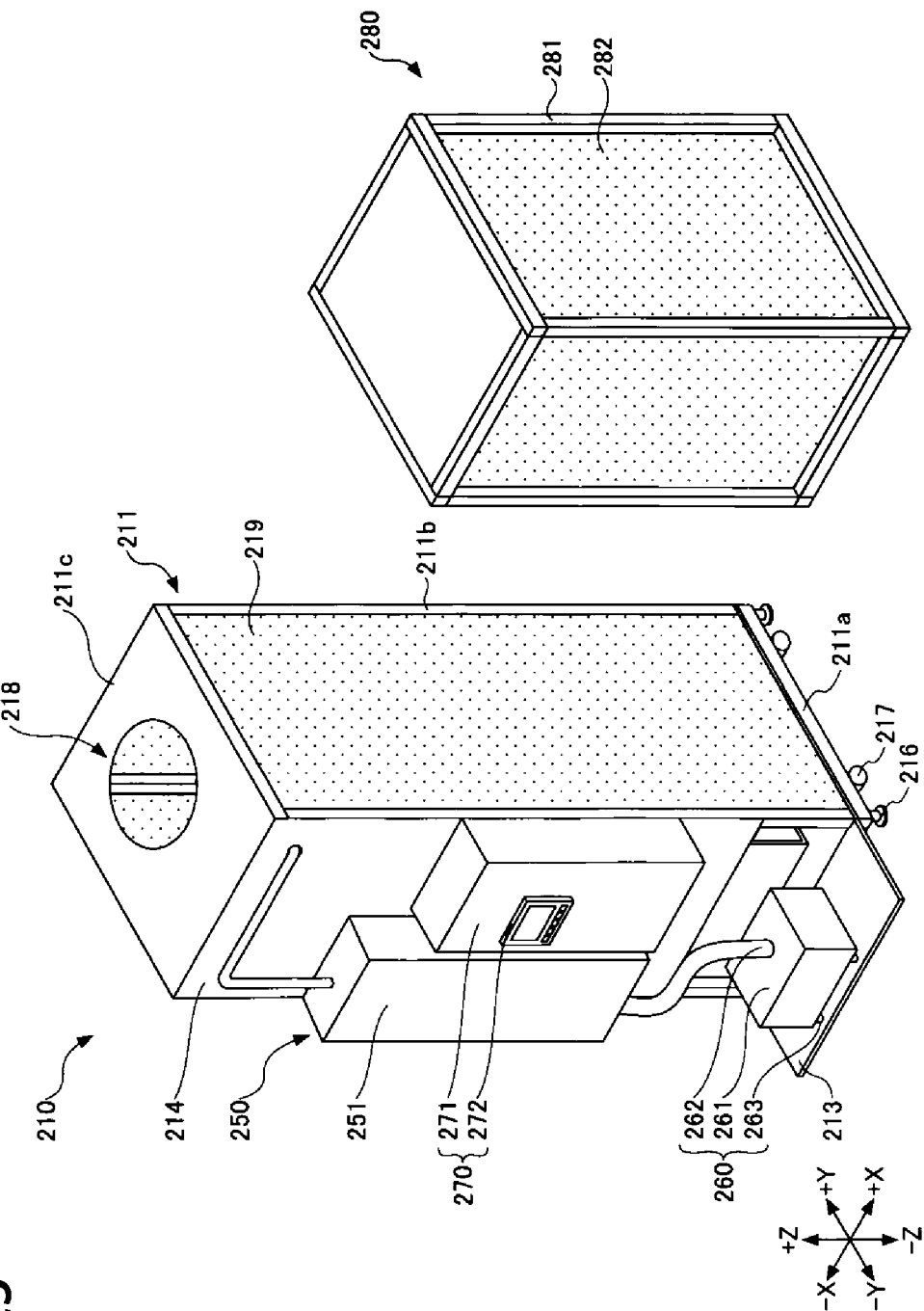
FIG. 25 is a perspective view illustrating an exemplary configuration of a protective member of the assembling apparatus.

As illustrated in FIG. 25, the assembling apparatus 200 may include a detachable protective member 280 on the body 210. FIG. 25 is a perspective view illustrating an exemplary configuration of the protective member 280 of the assembling apparatus 200. A state where the body 210 and the protective member 280 are separated is illustrated in FIG. 25.

As illustrated in FIG. 25, the protective member 280 is a frame body 281 formed, for example, by connecting twelve aluminum frames. A protective sheet 282 formed of, for example, a soft polyvinyl chloride film that has flameproofness, transparency, and an antistatic effect is attached to each surface of the frame body 281 except the lower surface. By providing the protective member 280 on the body 210, it is possible to prevent the reaction tube 34 from being brought into contacted with other members when the reaction tube 34 is raised while being held by the lifting mechanism 230. Further, since the protective member 280 is detachable with respect to the body 210, it is possible to convey the protective member 280 separately when the assembling apparatus 200 is conveyed. Further, a protective sheet 219 may be attached to the side surface of the body where the side plate 214 is not provided as in the case of the protective member 280.

(Assembling Method for Semiconductor Manufacturing Apparatus)

Figure 26:
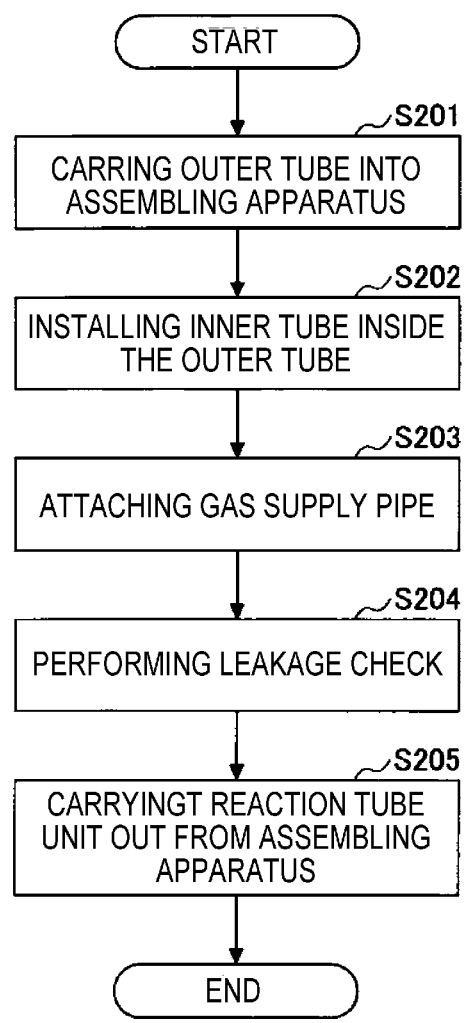
FIG. 26 is a flowchart illustrating an example of an assembling method for the semiconductor manufacturing apparatus according to the second embodiment.

As an example of an assembling method for the semiconductor manufacturing apparatus according to the second embodiment, a case where a reaction tube unit of a longitudinal heat treatment apparatus having a double tube structure is assembled by using the above assembling apparatus 200 will be described. FIG. 26 is a flowchart illustrating an example of an assembling method for the semiconductor manufacturing apparatus according to the second embodiment.

As illustrated in FIG. 26, the assembling method for the semiconductor manufacturing apparatus according to the second embodiment includes a step of carrying the outer tube 46 into the assembling apparatus 200 (S201), a step of installing the inner tube 44 inside the outer tube 46 (S202), a step of attaching the gas supply pipe (S203), a step of performing a leakage check (S204), and a step of carrying the reaction tube unit out from the assembling apparatus 200 (S205). Hereinafter, respective steps will be described.

FIGS. 27A to 27C are explanatory views for step S201 of carrying the outer tube 46 into the assembling apparatus 200. In step S201, firstly, the outer tube 46 is conveyed to the assembling apparatus 200 by the carriage 500 that mounts the outer tube 46 supported by the cart 510 at its lower end portion (see FIG. 27A). The assembling apparatus 200 and the carriage 500 are positioned by connecting the distal end of the carriage 500 to the positioning portion 215 of the assembling apparatus 200. Guide rails 520 are provided on the carriage 500 to be connected to the guide rails 221 of the assembling apparatus 200 in a state of being positioned with the assembling apparatus 200. Subsequently, in a state where the lifting unit 232 is evacuated below the guide rails 221, the cart 510 is moved on the guide rails 520 of the carriage 500 and the guide rails 221 of the assembling apparatus 200 to carry the outer tube 46 into the assembling apparatus 200. Subsequently, the distal end of the carriage 500 is separated from the positioning portion 215 of the assembling apparatus 200 (see FIG. 27B). Subsequently, the cart 510 that supports the lower end portion of the outer tube 46 is held by the lifting unit 232, by moving the lifting unit 232 upward. Subsequently, the outer tube 46 supported by the cart 510 is raised and the outer tube 46 is fixed to the flange fixing portion 218 (see FIG. 27C), by raising the lifting unit 232 while holding the cart 510. Subsequently, the lifting unit 232 is lowered so as to place the empty cart 510 on the guide rails 221. Subsequently, the distal end of the empty carriage 500 where the cart 510 is not mounted on is connected to the positioning portion 215 of the assembling apparatus 200. Then, the empty cart 510 is carried out from the assembling apparatus 200 by moving the empty cart 510 on the guide rails 221 of the assembling apparatus 200 and the guide rails 520 of the carriage 500.

FIGS. 28A to 28C are explanatory views for step S202 of attaching the inner tube 44 to the inside of the outer tube 46. In step S202, firstly, the inner tube 44 is conveyed to the assembling apparatus 200 by the carriage 500 that mounts the inner tube 44 supported by the cart 510 at its lower end portion (see FIG. 28A). The assembling apparatus 200 and the carriage 500 are positioned by connecting the distal end of the carriage 500 to the positioning portion 215 of the assembling apparatus 200. Subsequently, in a state where the lifting unit 232 is evacuated below the guide rails 221, the cart 510 is moved on the guide rails 520 of the carriage 500 and the guide rails 221 of the assembling apparatus 200 to carry into the assembling apparatus 200. Subsequently, the distal end of the carriage 500 is separated from the positioning portion 215 of the assembling apparatus 200 (see FIG. 28B). Subsequently, the cart 510 that supports the lower end portion of the inner tube 44 is held by the lifting unit 232, by moving the lifting unit 232 upward. Subsequently, the inner tube 44 supported by the cart 510 is raised and the inner tube 44 is accommodated in and attached to the inside of the outer tube 46 fixed to the flange fixing portion 218 (see FIG. 28C), by raising the lifting unit 232 while holding the cart 510. Subsequently, the lifting unit 232 is lowered so as to place the empty cart 510 on the guide rails 221. Subsequently, the distal end of the empty carriage 500 where the cart 510 is not mounted on is connected to the positioning portion 215 of the assembling apparatus 200. Then, the empty cart 510 is carried out from the assembling apparatus 200 by moving the empty cart 510 on the guide rails 221 of the assembling apparatus 200 and the guide rails 520 of the carriage 500.

Figure 29A:
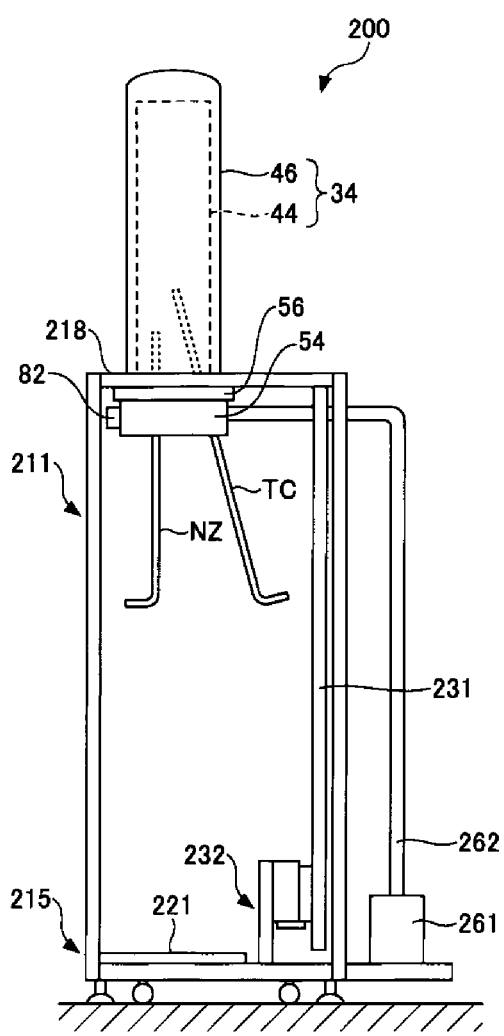
FIGS. 29A and 29B are explanatory views for a step of attaching a gas supply pipe.
Figure 29B:
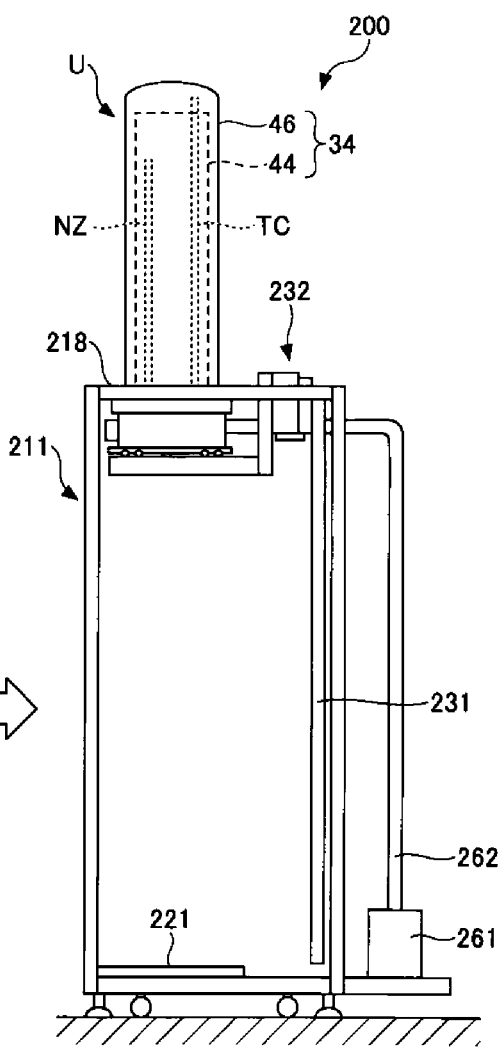

FIGS. 29A and 29B are explanatory views for step S203 of attaching the gas supply pipe. In step S203, firstly, the lower end portion of the reaction tube 34 is opened by moving the lifting unit 232 downward from the position where the lifting unit 232 was holding the inner tube 44 so as to evacuate it. Subsequently, the gas supply pipe NZ and the temperature sensor TC are inserted (see FIG. 29A) to the inside of the reaction tube 34 from the opening at the lower end portion of the reaction tube 34, and the gas supply pipe NZ and the temperature sensor TC are attached to the reaction tube 34. As a result, the reaction tube unit U is formed (see FIG. 29B). In a case where the temperature sensor TC is not attached to the inside of the reaction tube 34, the temperature sensor TC may not be attached. Further, in a case where other members to be attached to the inside of the reaction tube 34 are present, the other members may be attached in step S203 of attaching the gas supply pipe NZ.

Figure 30A:
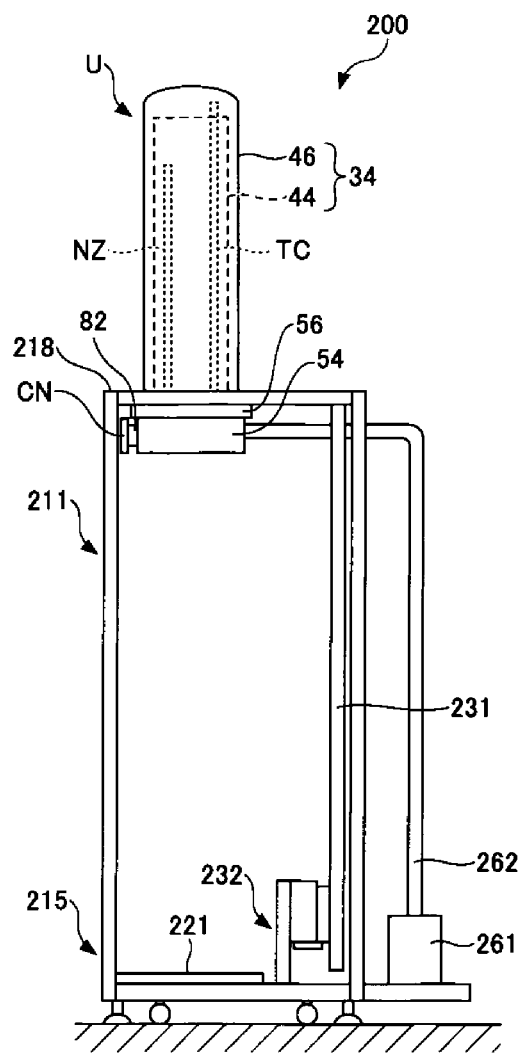
FIGS. 30A and 30B are explanatory views for a step of performing a leakage check.
Figure 30B:
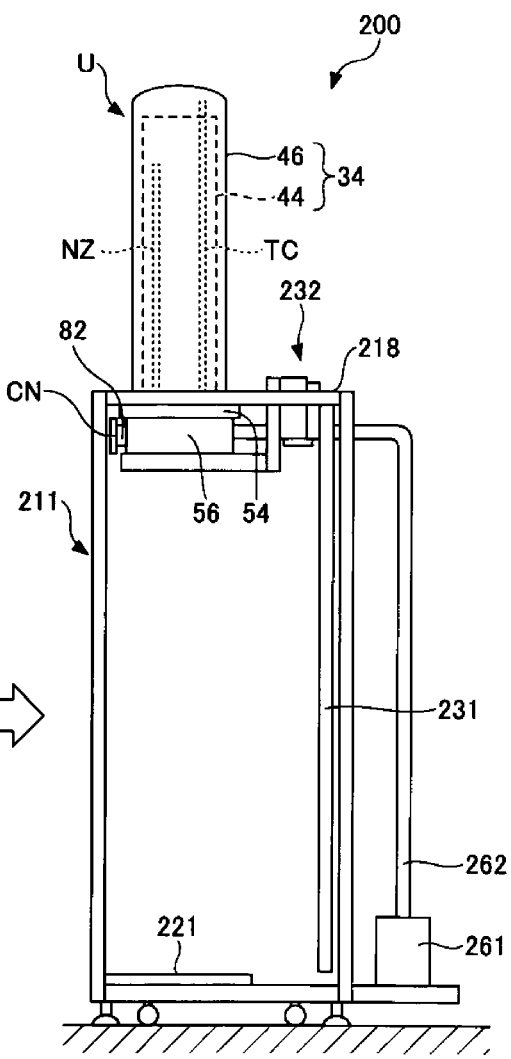

FIGS. 30A and 30B are explanatory views for step S204 of performing the leakage check. In step S204, firstly, the inside of the reaction tube 34 and the exhaust device 261 are communicated (see FIG. 30A) by attaching the exhaust pipe 262 to the gas outlet 82 of the outer tube 46 through a joining member CN. As a result, it is possible to exhaust the inside of the reaction tube 34 by the exhaust device 261. Subsequently, by raising the first lifting unit 232, the opening at the lower end portion of the reaction tube 34 is air-tightly closed by the lifting unit 232 (cover) (see FIG. 30B). Subsequently, the leakage check for the inside of the reaction tube 34 is performed while exhausting the inside of the reaction tube 34 through the exhaust pipe 262 and the gas outlet 82 of the cover 140, by the exhaust device 261. A method for the leakage check is not particularly limited, but may be, for example, a helium leak test method (JISZ2331), or a leak test method (JISZ2332) based on pressure change such as a build-up method.

Figures 31A, 31B:
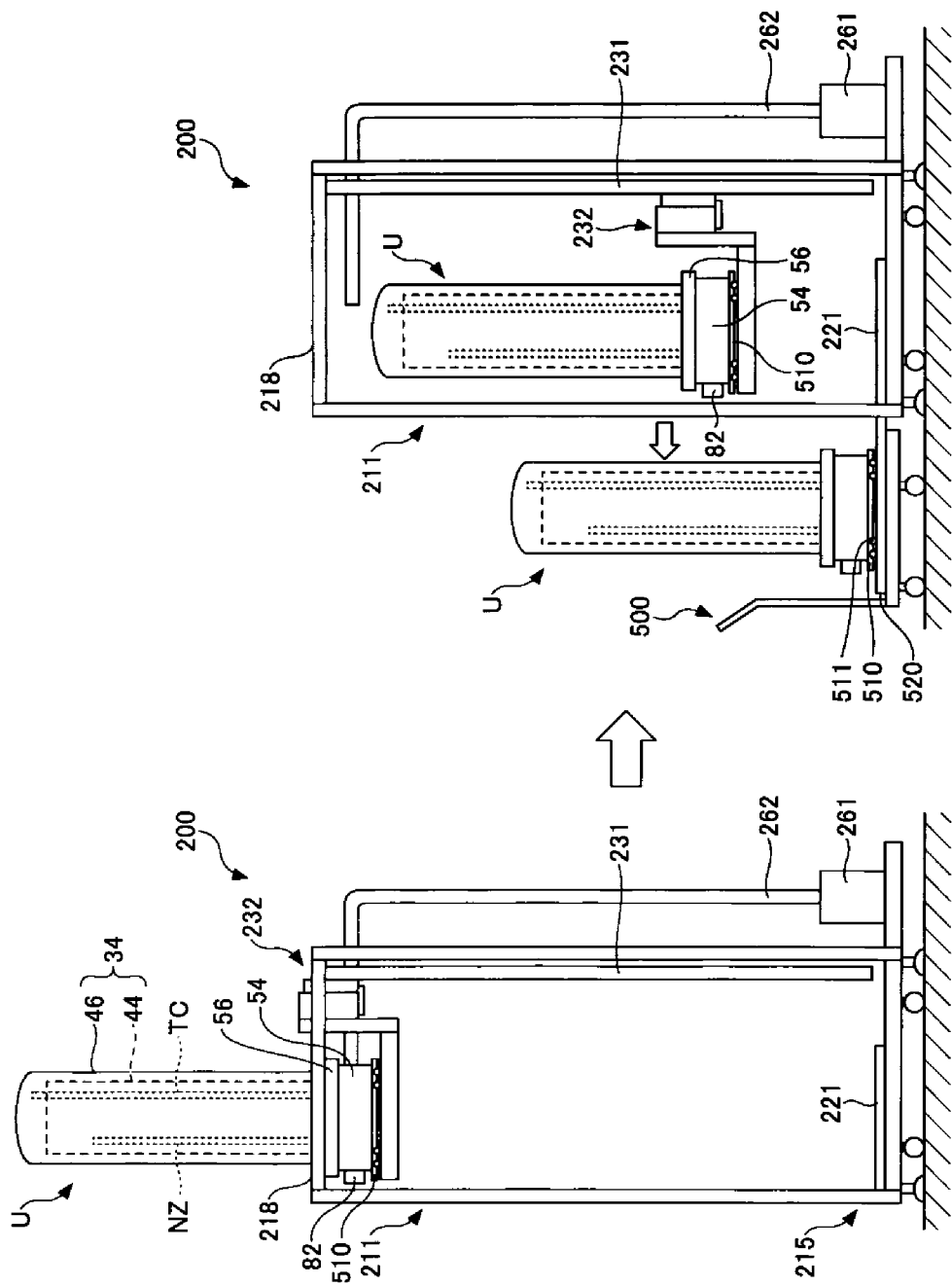
FIGS. 31A and 31B are explanatory views for a step of carrying a reaction tube unit out from the assembling apparatus.

FIGS. 31A and 31B are explanatory views for step S205 of carrying the reaction tube unit U out from the assembling apparatus 200. In step S205, firstly, the joining member CN is separated and the lifting unit 232 is moved downward from the guide rails 221, and the empty cart 510 is carried onto the guide rails 221 of the assembling apparatus 200. Subsequently, by moving the lifting unit 232 upward, the lifting unit 232 is raised in a state where the cart 510 is held by the lifting unit 232, so that the upper surface of the cart 510 and the lower end portion of the manifold 54 are brought into contact (see FIG. 31A). Subsequently, the outer tube 46 is separated from the fixing portion 218. As a result, the reaction tube unit U is placed on the cart 510. Subsequently, the cart 510 that holds the reaction tube unit U is placed on the guide rails 221 of the assembling apparatus 200 (see FIG. 31B) by lowering the lifting unit 232. Subsequently, the distal end of the empty carriage 500 where the cart 510 is not mounted on is connected to the positioning portion 215 of the assembling apparatus 200. Then, the reaction tube unit U is carried out from the assembling apparatus 200 by moving the cart 510 that holds the reaction tube unit U on the guide rails 221 of the assembling apparatus 200 and the guide rails 520 on the carriage 500 (see FIG. 31B).

In this manner, the reaction tube unit U may be assembled. The assembled reaction tube unit U is conveyed to, for example, the place to be provided.

The assembling apparatus 200 described above includes the body 210, the lifting mechanism 230 that moves the inner tube 44 and the outer tube 46 vertically, the gas supply mechanism 250 that supplies the gas into the reaction tube 34, and the exhaust mechanism 260 that exhausts the inside of the reaction tube 34. According to the assembling apparatus 200 having this configuration, the reaction tube unit U may be assembled at a place different from a place where the longitudinal heat treatment apparatus is provided, and thus, it is easy to secure an operation space. As a result, since a plurality of operators may simultaneously perform the assembling operation of the reaction tube unit U, it is possible to reduce an assembling work period of the longitudinal heat treatment apparatus. Further, it is possible to reduce downtime of the longitudinal heat treatment apparatus by assembling the reaction tube unit U in advance at a place different from a place where the longitudinal heat treatment apparatus is provided, and having a system capable of immediately providing the reaction tube unit U when necessary.

Further, according to the assembling apparatus 200, the inside of the reaction tube 34 may be exhausted through the exhaust port formed by penetrating the plate-like portion of the cover, in a state where the opening at the lower end portion of the reaction tube 34 is air-tightly closed by the cover. As a result, the leakage check for the inside of the reaction tube 34 may be performed in the assembling step of the reaction tube unit U. Therefore, even if a leakage is found at the inside of the reaction tube 34, the reaction tube unit U may be easily reassembled by using the assembling apparatus 200.

According to the present disclosure, it is possible to reduce the assembling working period of the semiconductor manufacturing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An assembling apparatus for a semiconductor manufacturing apparatus, the assembling apparatus comprising:
   a body;
   a lift attached to the body and configured to move a reaction tube having an opening at a lower end portion thereof vertically;
   a gas supply source configured to supply a gas into the reaction tube through the opening while the reaction tube is held by the lift; and
   an exhaust path including a pump configured to exhaust an inside of the reaction tube through the opening, thereby performing a leakage test of the reaction tube while the reaction tube is held by the lift.

2. The assembling apparatus of claim 1, further comprising:
   a cover configured to air-tightly close the opening of the reaction tube.

3. The assembling apparatus of claim 2, wherein the cover is connected to the gas supply source through a pipe.

4. The assembling apparatus of claim 2, wherein the reaction tube has a double tube structure including an inner tube and an outer tube.

5. The assembling apparatus of claim 4, wherein the lift includes:
   a guide that is fixed to the body and extends in a vertical direction;
   a first sub-lift that is attached to the guide to be movable vertically, and holds the outer tube; and
   a second sub-lift that is attached to the guide below the first sub-lift to be movable vertically, and holds the inner tube.

6. The assembling apparatus of claim 4, wherein the body includes a flange fixing portion that fixes and holds the outer tube,
   the lift includes:
   a guide that is fixed to the body and extends in a vertical direction; and
   a third sub-lift that is attached to the guide to be movable vertically, and holds the outer tube and the inner tube.

7. The assembling apparatus of claim 2, wherein the cover includes:
   a plate that air-tightly closes the opening of the reaction tube; and
   a gas port formed by penetrating the plate,
   wherein the gas supply introduces a gas into the reaction tube through the gas port, and
   the exhaust path exhausts the inside of the reaction tube through the gas port when performing the leakage test.

8. The assembling apparatus of claim 2, further comprising:
   a slide including a rail that is attached to the body, and moves the reaction tube in a horizontal direction such that the reaction tube is guided into body of the assembling apparatus or guided out from the body of the assembling apparatus.

9. The assembling apparatus of claim 8, wherein the body includes a positioning portion connected to a carriage that conveys the reaction tube.

10. The assembling apparatus of claim 1, further comprising:
    a slide including a rail that is attached to the body, and moves the reaction tube in a horizontal direction such that the reaction tube is guided into body of the assembling apparatus or guided out from the body of the assembling apparatus.

11. The assembling apparatus of claim 1, wherein a positioning portion connected to a carriage that conveys the reaction tube is formed in the body.

* * * * *